(12) United States Patent
Carlough et al.

(10) Patent No.: US 10,419,035 B2
(45) Date of Patent: Sep. 17, 2019

(54) USE OF MULTIPLE CYCLIC REDUNDANCY CODES FOR OPTIMIZED FAIL ISOLATION

(71) Applicant: International Business Machines Corporation, Armonk, NY (US)

(72) Inventors: Steven R. Carlough, Poughkeepsie, NY (US); Patrick J. Meaney, Poughkeepsie, NY (US); Gary Van Huben, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/817,399

(22) Filed: Nov. 20, 2017

(65) Prior Publication Data

US 2019/0158126 A1    May 23, 2019

(51) Int. Cl.
    *H03M 13/00*    (2006.01)
    *H03M 13/35*    (2006.01)
    *H04L 1/00*     (2006.01)

(52) U.S. Cl.
    CPC ........ *H03M 13/353* (2013.01); *H04L 1/0041* (2013.01); *H04L 1/0045* (2013.01); *H04L 1/0061* (2013.01)

(58) Field of Classification Search
    None
    See application file for complete search history.

(56) References Cited

U.S. PATENT DOCUMENTS

| | | | |
|---|---|---|---|
| 5,844,918 A | * | 12/1998 | Kato .................... H03M 13/03 714/751 |
| 6,175,941 B1 | | 1/2001 | Poeppelman |
| 6,522,665 B1 | | 2/2003 | Suzuki |

(Continued)

FOREIGN PATENT DOCUMENTS

| | | |
|---|---|---|
| EP | 1302382 A2 | 4/2003 |
| EP | 1826909 A2 | 8/2007 |

(Continued)

OTHER PUBLICATIONS

Gangopadhyay et al., "Multiple-bit Parity-based Concurrent Fault Detection Architecture for Parallel CRC Computation", IEEE, 2015, 14 pages.

(Continued)

*Primary Examiner* — Mujtaba M Chaudry
(74) *Attorney, Agent, or Firm* — Cantor Colburn LLP; Bryan Bortnick

(57) ABSTRACT

Aspects of the invention include calculating, by a transmitter, source cyclic redundancy code (CRC) bits for payload bits. The source CRC bits include source CRC bits for a first type of CRC check and source CRC bits for a second type of CRC check. The source CRC bits are stored at the transmitter. The payload bits and the source CRC bits for the first type of CRC check are transmitted to the receiver. The receiver performs the first type of CRC check based at least in part on the payload bits and the source CRC bits for the first type of CRC check. The receiver also calculates and stores at the receiver calculated CRC bits for the second type of CRC check. If the first type of CRC check indicates an error, a comparison of the source and calculated CRC bits for the second type of CRC check is initiated.

19 Claims, 16 Drawing Sheets

(56) References Cited

U.S. PATENT DOCUMENTS

| | | | |
|---|---|---|---|
| 6,598,189 B1 | 7/2003 | Zhao et al. | |
| 6,601,216 B1* | 7/2003 | Obata | H03M 13/093 |
| | | | 714/807 |
| 6,658,076 B1 | 12/2003 | Hayata | |
| 6,820,228 B1 | 11/2004 | Keller | |
| 7,047,453 B2 | 5/2006 | Lappin, Jr. | |
| 7,227,797 B2* | 6/2007 | Thayer | G06F 11/1044 |
| | | | 365/200 |
| 7,613,991 B1 | 11/2009 | Bain | |
| 8,074,150 B2* | 12/2011 | Buckley | H03M 13/09 |
| | | | 714/758 |
| 8,099,651 B2 | 1/2012 | Normoyle et al. | |
| 9,287,896 B2* | 3/2016 | Seo | H03M 13/09 |
| 9,298,668 B2 | 3/2016 | Thayer | |
| 2002/0012343 A1 | 1/2002 | Holloway et al. | |
| 2003/0093743 A1 | 5/2003 | Berry, Jr. et al. | |
| 2004/0123221 A1 | 6/2004 | Huffman et al. | |
| 2004/0158794 A1 | 8/2004 | Niesen | |
| 2005/0144222 A1 | 6/2005 | Anderson et al. | |
| 2007/0297451 A1 | 12/2007 | Kim | |
| 2010/0205518 A1 | 8/2010 | Golitschek Edler Von Elbwart et al. | |
| 2011/0004817 A1 | 1/2011 | Cheong et al. | |
| 2013/0080862 A1* | 3/2013 | Bennett | G06F 11/1076 |
| | | | 714/782 |
| 2013/0100012 A1 | 4/2013 | Todorovich et al. | |
| 2013/0132796 A1 | 5/2013 | Vummintala | |
| 2013/0145229 A1* | 6/2013 | Frayer | H03M 13/2903 |
| | | | 714/755 |
| 2014/0089516 A1 | 3/2014 | Sevin | |
| 2014/0328256 A1* | 11/2014 | Djukic | H04W 72/0413 |
| | | | 370/329 |
| 2016/0087825 A1 | 3/2016 | Tian et al. | |
| 2016/0217030 A1* | 7/2016 | Shin | G06F 11/085 |
| 2017/0075754 A1 | 3/2017 | Wang | |
| 2018/0062787 A1 | 3/2018 | Hsieh | |

FOREIGN PATENT DOCUMENTS

| | | |
|---|---|---|
| EP | 1742498 A1 | 10/2007 |
| EP | 2264905 A1 | 12/2010 |
| WO | 2004086633 A1 | 10/2004 |
| WO | 2014204373 A1 | 12/2014 |

OTHER PUBLICATIONS

List of IBM Patents or Patent Applictions Treated as Related; (Appendix P), Filed Nov. 20, 2017, 2 pages.

Steven R. Carloughl, et al., Pending U.S. Appl. No. 15/817,408 entitled "Dynamically Adjustable Cyclic Redundancy Code Rates," filed Nov. 20, 2017.

Steven R. Carloughl, et al., Pending U.S. Appl. No. 15/817,387 entitled "Dynamically Adjustable Cyclic Redundancy Code Types," filed Nov. 20, 2017.

Steven R. Carloughl, et al., Pending U.S. Appl. No. 15/817,416 entitled "Use of a Cyclic Redundancy Code Multiple-Input Shift Register to Provide Early Warning and Fail Detection ," filed Nov. 20, 2017.

Baicheva, "Determination of the Best CRC Codes with up to 10-Bit Redundancy", IEEE, 2008, 7 pages.

May, Phil, et al., "Improvement in bit-error rate for optoelectronic multicomputer interconnection networks using cyclic redundancy code error detection", IEEE Photonics Technology Letters 9.6 (1997): 848-850.

Moon, Jaekyun, et al.,"Cyclic redundancy check code based high-rate error-detection code for perpendicular recording", IEEE transactions on magnetics 42.5 (2006): 1626-1628.

Salmistraro et al., "Rate-adaptive BCH codes for distributed source coding", Springer, 2013, 14 pages.

* cited by examiner

USE OF MULTIPLE CYCLIC REDUNDANCY CODES FOR OPTIMIZED FAIL ISOLATION

BACKGROUND

Embodiments of the present invention relate in general to cyclic redundancy codes (CRCs) and more specifically to the use of multiple CRCs for optimized fail isolation.

A CRC is an error-detecting code that is commonly used in digital networks and storage devices to detect errors in transmitted data. In transmissions involving packet or frame based protocols a CRC is often used to protect the data that is being carried within a packet or frame of bits. A short check value (e.g., a CRC), is attached to blocks of data entering these systems. The short check value is derived using contents of the data blocks and can be calculated, for example, based on the remainder of a polynomial division of the contents of the data blocks.

In many applications it is sufficient to simply use a CRC as a means of determining success or failure in delivering a frame from a source to a destination. However, in some applications it is desirable to know failure information about the packet, or frame. The need for additional failure information often leads to the use of more complex CRCs which provide either improved error rate detection and/or isolation metrics. Having to analyze a fail in the combination of a physical channel medium and a transmission protocol can create situations where different CRCs are needed for different types of error isolation (e.g., frame isolation, lane isolation). In contemporary systems, this involves attempting to reproduce the fail by re-transmitting a failing frame(s) while applying one or more different CRCs.

SUMMARY

Embodiments of the present invention include methods, systems, and computer program products for using multiple cyclic redundancy codes (CRCs) for optimized fail isolation. A non-limiting example method includes calculating, by a transmitter coupled to a receiver via a communication channel, source CRC bits for payload bits in one or more frames of bits. The source CRC bits include source CRC bits for a first type of CRC check and source CRC bits for a second type of CRC check. The source CRC bits are stored at the transmitter. The payload bits and the source CRC bits for the first type of CRC check are transmitted via the communication channel to the receiver. The receiver performs the first type of CRC check based at least in part on the payload bits and the source CRC bits for the first type of CRC check. The receiver also calculates and stores at the receiver calculated CRC bits for the payload bits. The calculated CRC bits include calculated CRC bits for the second type of CRC check. A status of the first type of CRC check is received from the receiver. Based on the status of the first type of CRC check indicating an error, a comparison of previously calculated CRC bits including the source CRC bits for the second type of CRC check and the calculated CRC bits for the second type of CRC check is initiated.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
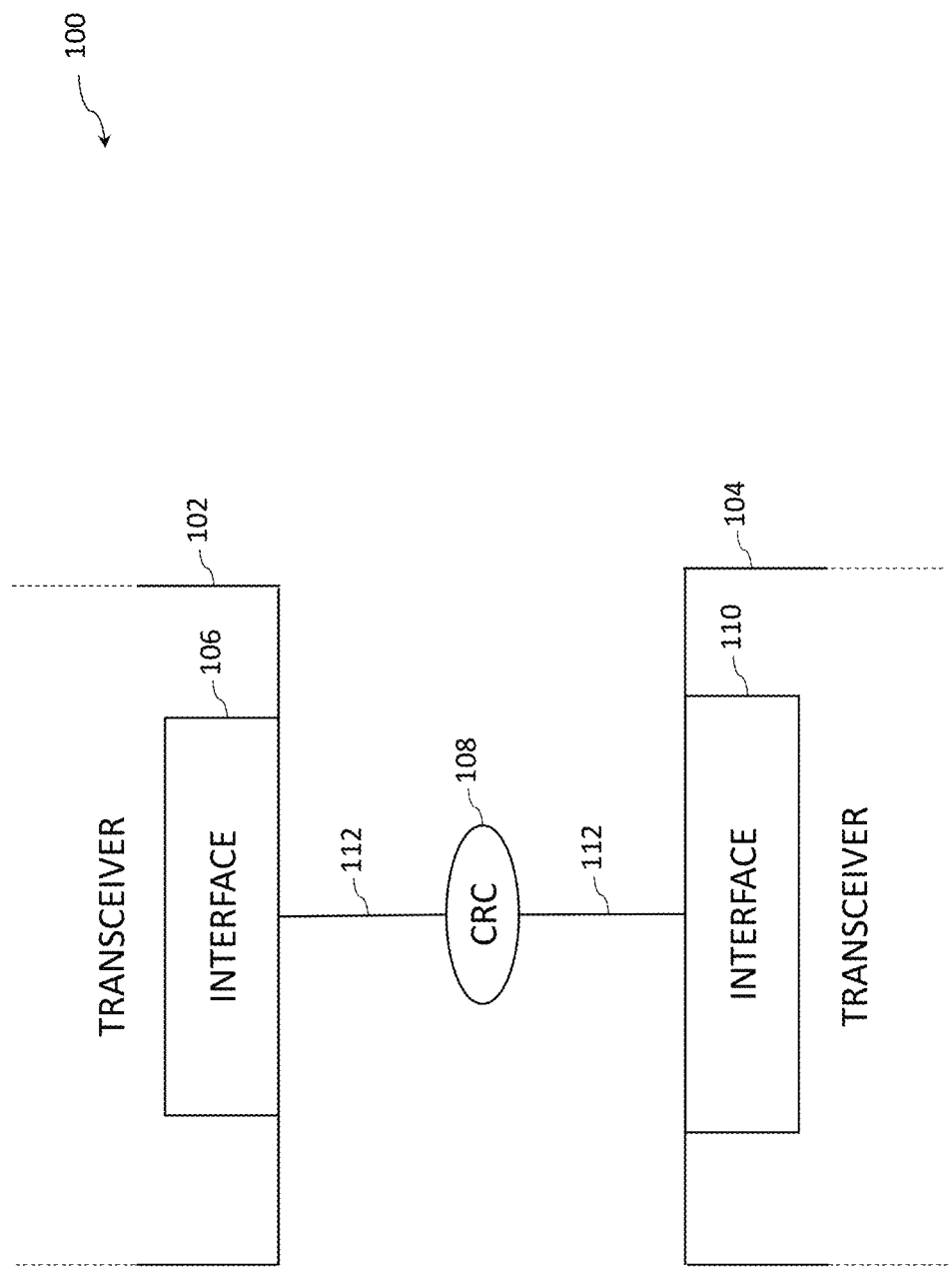
FIG. 1 depicts a high level block diagram of a system for data transmission in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

One or more embodiments of the present invention, upon detecting a fail in a transmission of a frame(s) of bits using a first cyclic redundancy code (CRC), analyzes information generated by multiple CRCs that were generated based on the failing frame (s) to perform detailed analysis and fault isolation. The detailed analysis and fault isolation are performed without having to reproduce the fail during subsequent transmissions. In accordance with one or more embodiments of the present invention, multiple CRCs are applied simultaneously to expedite the fail analysis and fail isolation process, thereby avoiding the need to sequentially switch to new CRCs while attempting to rediscover the fails.

Certain fail mechanisms can be very intermittent, thereby leading to difficulty in further isolating the failing frame or lane after the initial detection occurs. In accordance with one or more embodiments of the present invention, multiple CRC generation and compare circuits are utilized to track multiple CRCs simultaneously. For example, the base or default CRC can be optimized for maximum detection especially when there is a large payload-to-CRC ratio; a second CRC can be optimized for frame isolation to determine exactly which operational sequences require retry or retransmission if a fail occurs; and a third CRC can be geared towards lane isolation.

In accordance with one or more embodiments of the present invention, CRC tracing mechanisms are located on both the transmit side, or driving side, and the receive side of a transmission interface, such as, but not limited to a communication channel. In one or more embodiments described herein, the CRC tracing mechanisms (which can be implemented by a CRC control module) are used for generating and locally storing each CRC as the payload frames are being transmitted. For example, as each frame is generated on the transmitting side, a partial CRC based on the frame is also generated for purposes of combining with subsequent frames to form the final CRC for a payload sequence that includes one or more frames. Each partial code for each CRC type can be stored in a CRC trace buffer. At the end of the payload stream, the final (full) CRC code for each type of CRC is preserved in the buffer. In accordance with one or more embodiments of the present invention, since there is a time lag between the driving side sending the full CRC and eventually receiving a response, the depth of the CRC trace buffer is of sufficient size to retain the CRC bits for past payload sequences. The depth of the CRC trace buffer can be a function of internal pipelining and the round trip latency of the interface. Known interfaces such as high speed SERDES (HSS) interfaces employ frame based protocols and have established frame round trip latency (FRTL) procedures for determining the round trip timings. This information can be used to set the depth of the CRC trace buffer and match incoming upstream responses with CRC trace buffer entries to determine which entries can be retired from the buffer.

In accordance with one or more embodiments of the present invention, upon identification of a CRC error, a transmitting side (e.g., a host computer) enters a recovery window where it sends agreed upon "special" frames to alert the receiving side to enter into a recovery mode and to disable the normal CRC checking. The transmitting side then extracts the bits for the multiple types of CRCs (e.g., detection based, lane based, frame based, beat based, etc.) from the CRC trace buffer and transmits them to the receiving side where they are compared against a matching CRC trace buffer. Since each CRC is optimized for a different type of detection or isolation, the receiving side immediately is afforded the opportunity to identify the failing frame and failing lane. Thus, one or more embodiments of the present invention prevent having to switch to a new CRC scheme or a different payload-to-CRC ratio, resume normal operation, and wait for the fail to occur again to gain more insight into a fail condition. This ability to diagnose all facets in parallel, as provided by one or more embodiments of the present invention, can result in reduced overall system quiesce time and can also allow for more precise system policies for establishing CRC rates, CRC types, and deploying lane repairs.

It should also be noted that the same scheme of one or more embodiments of the present invention can be applied in any direction of the transmission interface and it works similarly in reverse. For example, upon receiving a CRC error, the host or driving side can also enter a recovery window that includes transmitting special frames which inform the receiving side to take the contents of the CRC trace buffer and deliver them back to the driving side where the comparison and fail isolation assessment can be performed. In certain topologies this arrangement may be more efficient than performing the detailed analysis and fault isolation on the receiver.

As used herein, the term "packet" refers to a formatted unit of bits transmitted between an origin and a destination on the Internet or any other packet-switched network. A packet typically includes user bits (also referred to herein as a "payload") and control information that is used to deliver the payload. Examples of packet based protocols include, but are not limited to, Internet Protocol and OpenCAPI. The term "frame" refers to bits that are transmitted between an origin and a destination as a unit. A frame can be transmitted serially (bit by bit) and can include frame synchronization bits to indicate the beginning and end of the payload bits within a frame. Examples of frame based protocols include, but are not limited to, Ethernet and Peripheral Component Interconnect (PCI). It should be noted that that terms packet and frame are synonymous and that most protocols include multiple "packets" of information that together comprise a "frame." The terms "packet" and "frame" are used interchangeably herein to refer to data (e.g., payload bits and/or CRC bits) that are transmitted as a unit from an origin to a destination. As used herein, the term "payload sequence" refers to one or more frames that are transmitted as a unit and protected by the same group of CRC bits which typically are included in the last frame of the sequence. In an embodiment, the origin is a memory buffer and the destination is a host computer, or memory controller. In another embodiment, the origin is a host computer, or memory controller, and the destination is a memory buffer. In a further embodiment, the origin is a transmitter in a first network location and the destination is a receiver in a second network location.

Depending on the channel transmission medium, it is not uncommon to be able to transmit packets error free for very long periods of time and then occasionally observe a small number of bit errors for a temporary period of time. This implies that most of the time bandwidth is being unnecessarily sacrificed for CRC bits. However, since it is not possible to predict when (or if) this temporary error window will occur, and leaving the packets completely unprotected is typically deemed unacceptable, the de-facto standard is to accept some type of bandwidth overhead penalty by using CRC bits. Upon detection of a bad frame, a recovery sequence is enacted to identify the failing frame and to have the transmitting side (e.g., the host) determine whether the failing frame and any subsequent frames require retransmission.

One or more embodiments of the present invention allow for the use of agnostic protocols when the channel that the data is being transmitted over connects two autonomous entities capable of influencing data coherency. In one or more embodiments of the present invention, the host computer, or host, is not aware of the type of memory connected to it (e.g. DDR3 or DDR4). The host, for example, sends sequences of reads and writes to a memory buffer and expects the memory buffer to process them in a coherent manner. If, for example, there were no CRC protection and a command was missed (or misinterpreted) then there is a risk of not detecting a read versus write collision, and thus updating or returning data in a non-coherent fashion. This example highlights the importance of proper CRC protection, especially in a high RAS environment.

Turning now to FIG. 1, a high level block diagram of a system 100 for data transmission is generally shown in accordance with one or more embodiments of the present invention. FIG. 1 depicts a transceiver 102 having an interface 106 to a communication channel 112 for transmitting data to another transceiver 104 that also has an interface 106 to the communication channel 112. The communication channel 112 can be implemented as two unidirectional buses (one bus in each direction, each bus checked with CRC), or it can be implemented as a bi-directional bus with CRC checking in each direction. In an embodiment of the present invention, the communication channel 112 includes several wires or data bit lanes for transmitting data bits in parallel. In another embodiment of the present invention, the communication channel 112 is made up a single data bit lane and bits are sent one at a time in a serial manner. As shown in FIG. 1, errors in the data transmitted across the communication channel 112 are detected using CRC 108 (which may include one or more types of CRCs being applied in parallel). In accordance with an embodiment of the invention, either transceiver 102 or transceiver 104 can act as a transmitter of data or as a receiver of data across the communication channel 112. In an embodiment of the present invention, CRC control instructions, and optionally a programmable register, to perform a CRC check and modify the CRC (e.g., rate or type) as described herein are located in and/or executed by each of the transceivers 102 104. The system 100 shown in FIG. 1 is an example of a system having a single communication channel between a transmitter of frames of bits and a receiver of the frames of bits. The number and/or type of wires or data lanes in each direction across the communication channels may be different.

In an embodiment of the present invention, the system 100 shown in FIG. 1 is a communication system for sending frames between a transmitter and a receiver. In an embodiment, the communication channel 112 includes a physical link that is provided between the transmitter and receiver. The physical link can include one or more wires connecting the transmitter and receiver by way of a cable, backplane (or planar board or motherboard), connectors, cards (or expansion cards), ball grid array (BGA) packaging, flip chip packaging, etc. In another embodiment, a wireless link is provided between the transmitter and the receiver and wireless communications that employ a packet protocol whose transmission is CRC protected are implemented.

In an embodiment of the present invention, the system 100 shown in FIG. 1 is a memory subsystem such as that shown in FIG. 4 below where transceiver 102 is implemented by a host computer, or memory controller, transceiver 104 is implemented by a unified memory buffer, and communication channel 112 is implemented by a high speed memory channel.

In one or more embodiments of the present invention, the communication channel 112 is unidirectional and one or both of transceiver 102 and transceiver 104 are implemented by a transmitter and/or a receiver.

Figure 2:
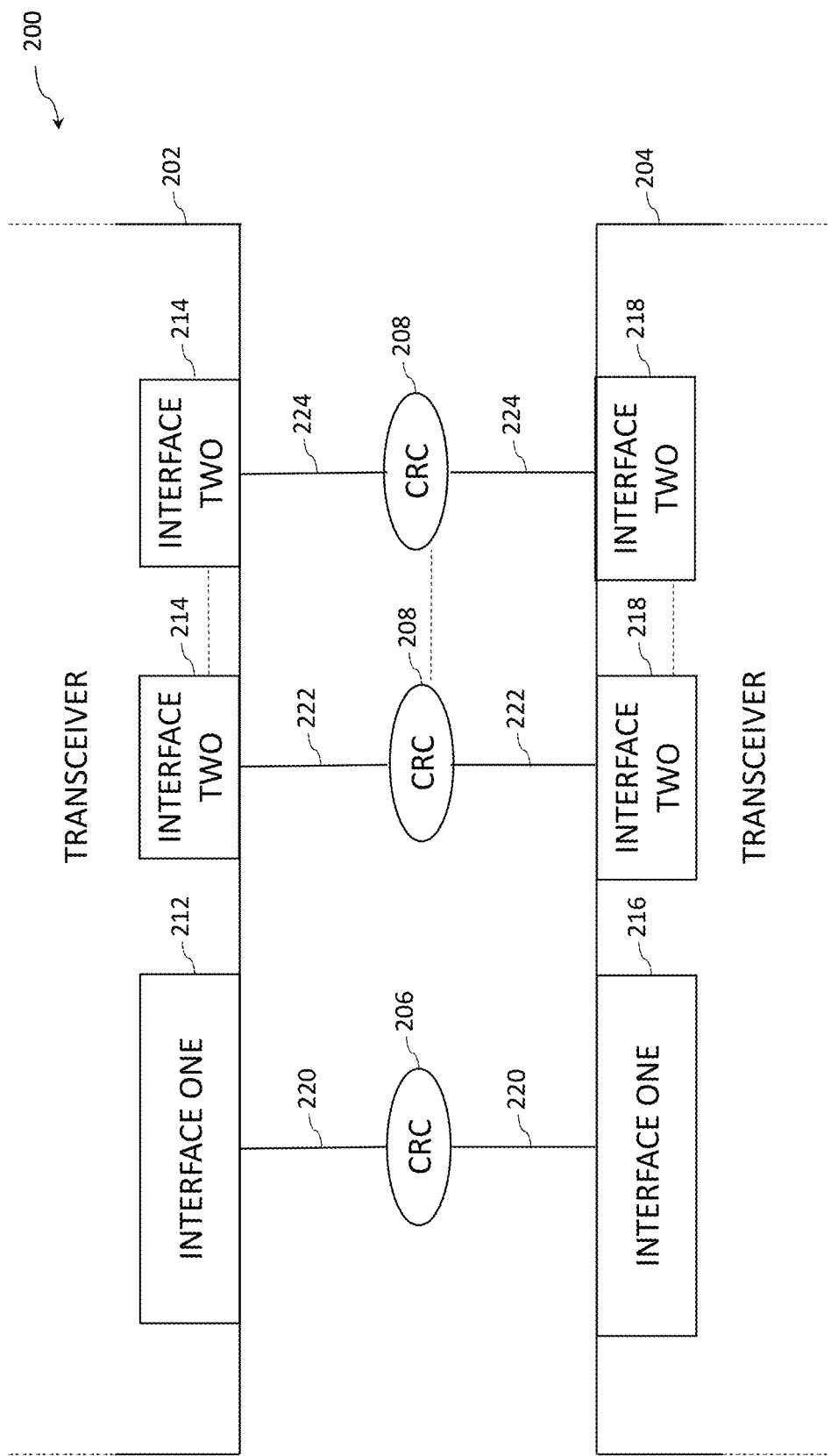
FIG. 2 depicts a high level block diagram of a system for data transmission in accordance with one or more embodiments of the present invention.

Turning now to FIG. 2, a high level block diagram of a system 200 for data transmission is generally shown in accordance with one or more embodiments of the present invention. FIG. 2 depicts a transceiver 202 having two different interfaces 212 214 to three different communication channels 220 222 224 for transmitting data to another transceiver 204 that has corresponding interfaces 216 218 to the three different communication channels 220 222 224. As shown in the example embodiment in FIG. 2, communication channels 222 224 are the same type of communication channels and they are different than the type of communication channel 220. Differences can include but are not limited to: speed; bi-directional or unidirectional; number or type of wires; number or type of data lanes; type of data; and/or RAS requirements.

As shown in FIG. 2, transceiver 202 includes interface one 212 to communicate with communication channel 220 and transceiver 204 includes interface one 216 to communicate with communication channel 220. Interface one 212 on transceiver 202 and interface one 216 on transceiver 204 can both include CRC control instructions to communicate as described herein to coordinate the one or more types of CRCs being applied in parallel as part of CRC 206 on communication channel 220. Also as shown in FIG. 2, transceiver 202 includes interface two 214 to communicate with transceiver 204 via communication channel 222 and interface two 218 to communicate with transceiver 204 via with communication channel 222. Interface two 214 on transceiver 202 and interface two 218 on transceiver 204 can include CRC control instructions to communicate as described herein to coordinate the one or more types of CRCs being applied in parallel as part of CRC 208 on communication channel 222. Also as shown in FIG. 2, transceiver 202 includes interface two 214 to communicate with communication channel 224 and transceiver 204 includes interface two 218 to communicate with communication channel 224. Interface two 214 on transceiver 202 and interface two 218 on transceiver 204 can include CRC control instructions to communicate as described herein to coordinate the one or more types of CRCs being applied in parallel as part of CRC 208 on communication channel 224.

In an embodiment of the present invention, one or more of communication channels 220 222 224 includes several wires or data bit lanes for transmitting data bits in parallel. In an embodiment of the present invention, one or more of communication channels 220 222 224 are made up a single data bit lane and bits within a frame are sent one at a time in a serial manner. As shown in FIG. 2, errors in the data transmitted across communication channel 220 are detected using CRC 206 and errors in the data transmitted across communication channels 222 224 are detected using CRC 208.

In accordance with an embodiment of the invention, transceiver 102 or transceiver 104 can act as a transmitter of data or as a receiver of data across the communication channels 220 222 224. In an embodiment of the present invention, CRC control instructions to perform a CRC check and to apply multiple types of CRCs as described herein are located in and/or executed by each of the transceivers 202 204. The system 200 shown in FIG. 2 is an example of a system having multiple different types of communication channels between a transmitter of fames of bits and a receiver of the frames. The multiple communication channels can be of the same or different types and the CRC codes can be the same (e.g., CRC rate, CRC type) or they can be different.

In an embodiment of the present invention, the system 200 shown in FIG. 2 is a communication system for sending fames between a transmitter and a receiver. In an embodiment, the communication channels 220 222 224 include at least two different types of links that are provided between the transmitter and the receiver. One or more of the links can be a physical link that can include one or more wires connecting the transmitter and receiver by way of a cable, backplane (or planar board or motherboard), connectors, cards (or expansion cards), ball grid array (BGA) packaging, and/or flip chip packaging, etc. One or more links could also be a wireless link provided between the transmitter and the receiver, supported by wireless communications that employ a packet protocol whose transmission is CRC protected.

In an embodiment of the present invention, the system 200 shown in FIG. 2 represents a single logical interface where interface one 212 is used to convey frames of command/address/control bits and interface two 214 is used to convey frames of data bits. In an embodiment of the present invention, each link shown in FIG. 2 is logically discrete with communication channel 220 implemented with a cabled connection, and communication channels 222 224 are implemented as traces on a backplane connecting transceivers on chips.

In an embodiment of the present invention, the system 200 shown in FIG. 2 is a memory subsystem such as that shown in FIG. 3 below where transceiver 202 is implemented by a host computer, or memory controller, transceiver 204 is implemented by a distributed memory buffer, and communication channels 220 220 224 are implemented by high speed memory channels.

In one or more embodiments of the present invention, one or both of transceiver 202 and transceiver 204 are implemented by a transmitter and/or a receiver. In one or more embodiments of the present invention, two or more of interface one 212 and interfaces two 214 in transceiver 202 are implemented by different types of transmitters, receivers and/or transceivers. In one or more embodiments of the present invention, two or more of interface one 216 and interfaces two 218 in transceiver 204 are implemented by different types of transmitters, receivers and/or transceivers.

In one or more embodiments of the present invention, one or more of the communication channels 220 222 224 is unidirectional and one or both of transceiver 202 and transceiver 204 are implemented by a transmitter and/or a receiver.

Figure 3:
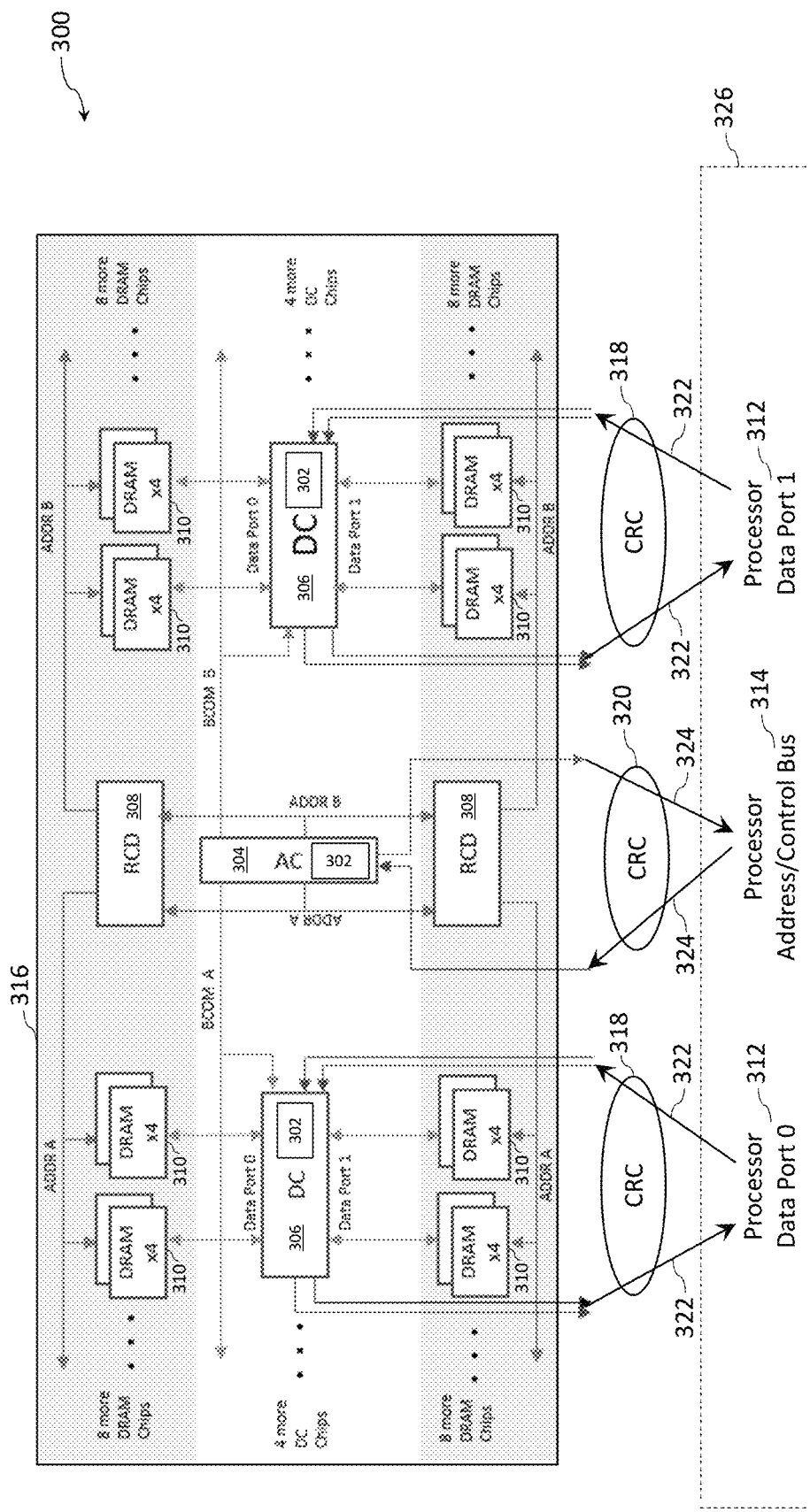
FIG. 3 depicts a block diagram of a system that includes a distributed memory buffer in accordance with one or more embodiments of the present invention.

Turning now to FIG. 3, a block diagram of a system 300 that includes a distributed memory buffer 316 is generally shown in accordance with one or more embodiments of the present invention. The distributed memory buffer 316 shown in FIG. 3 includes dynamic random access memories (DRAMS) 310, register clock drivers (RCDs) 308, data chips (DCs) 306, and an address/command chip (AC) 304. Each of the DCs 306 and the AC 304 include a CRC control module 302 for performing all or a subset of the CRC processing described herein. The logic in the CRC control modules 302 can vary based on different requirements (e.g., frame isolation, lane isolation) and different physical and/or logic differences between the channels. For example, at a given point in time, the logic in the CRC control module 302 located on the AC 304 can be different than the logic in the CRC control module 302 located on one or more of the DCs 306. Also, at a given point in time, the logic in the CRC control module 302 located on one DC 306 can be different than the logic in the CRC control module 302 located on another of the DCs 306. The CRC control module 302 may also include one or more registers for storing CRC related data such as, but not limited to, a CRC trace buffer, a CRC rate, an identifier of CRC types currently being used. Logic (e.g., CRC control module 302) to perform a CRC check and logic to compare multiple CRC results and to perform detailed analysis/fault isolation as described herein are located in and/or executed by both the distributed memory buffer 316 and the host computer 326.

FIG. 3 includes an address/control channel 324 that uses CRC 320 (which may include one or more types of CRCs being applied in parallel) for error detection. The address/control channel 324 is used to transmit address and control information between address/control ports on the distributed memory buffer 316 and address/control data ports 314 on the host computer 326. The address/control channel 324 is also used to transmit responses from the AC 304 to the host computer 326, with CRC included on the return path. Also shown in FIG. 3 are several data channels 322 that use CRC 318 (which may include one or more types of CRCs being applied in parallel) for error detection, the data channels 322 are used to transmit data between the data ports on the distributed memory buffer 316 and data ports 312 on the host computer 326. In accordance with one or more embodiments of the present invention, at any given point in time different CRC rates and types of CRCs may be used on all or a subset of the data channels 322 and address/control channel 324. Pairs of CRC control modules 302 (one on the distributed memory buffer 316 and the other on the host computer 326) can be used to synchronize, or coordinate, CRC rates and types across each of the channels 322 324. In an embodiment each of the data channels 322 is four lanes and the address/control channel 324 is eight lanes.

In accordance with one or more embodiments of the present invention, the address/control channel 324 and the data channels 322 are implemented by a serializer/deserializer (High Speed Serdes or "HSS") channel that transports frames of data in both directions. As shown in the embodiment of FIG. 3, the distributed memory buffer structure includes command and address interfaces with the AC 304, and data busses interfacing with a plurality of DCs 306.

In accordance with one or more embodiments of the present invention, the data channels 322 connected to the DCs 306 can contain as few as one or two data lanes. In this case, lane isolation is much simpler and potentially already taken care of by the error code correction (ECC) protection that accompanies the data. In the distributed memory buffer structure shown in FIG. 3, the frames interfacing with the AC 304 may require CRC protection while CRC protection might be optional for the frames containing data bits interfacing with the DCs 306. In addition, this type of structure may produce frames with only eight or sixteen bits available to use as CRC bits, which can be sufficient to protect against a reasonably sized stream of contiguous payload-only frames. One or more embodiments of the present invention provide the flexibility to adapt to any structure and to allow a system policy to customize the rate of CRC versus payload as well as whether to employ frame based CRC checking, lane isolation CRC checking, or any combination therein.

Figure 4:
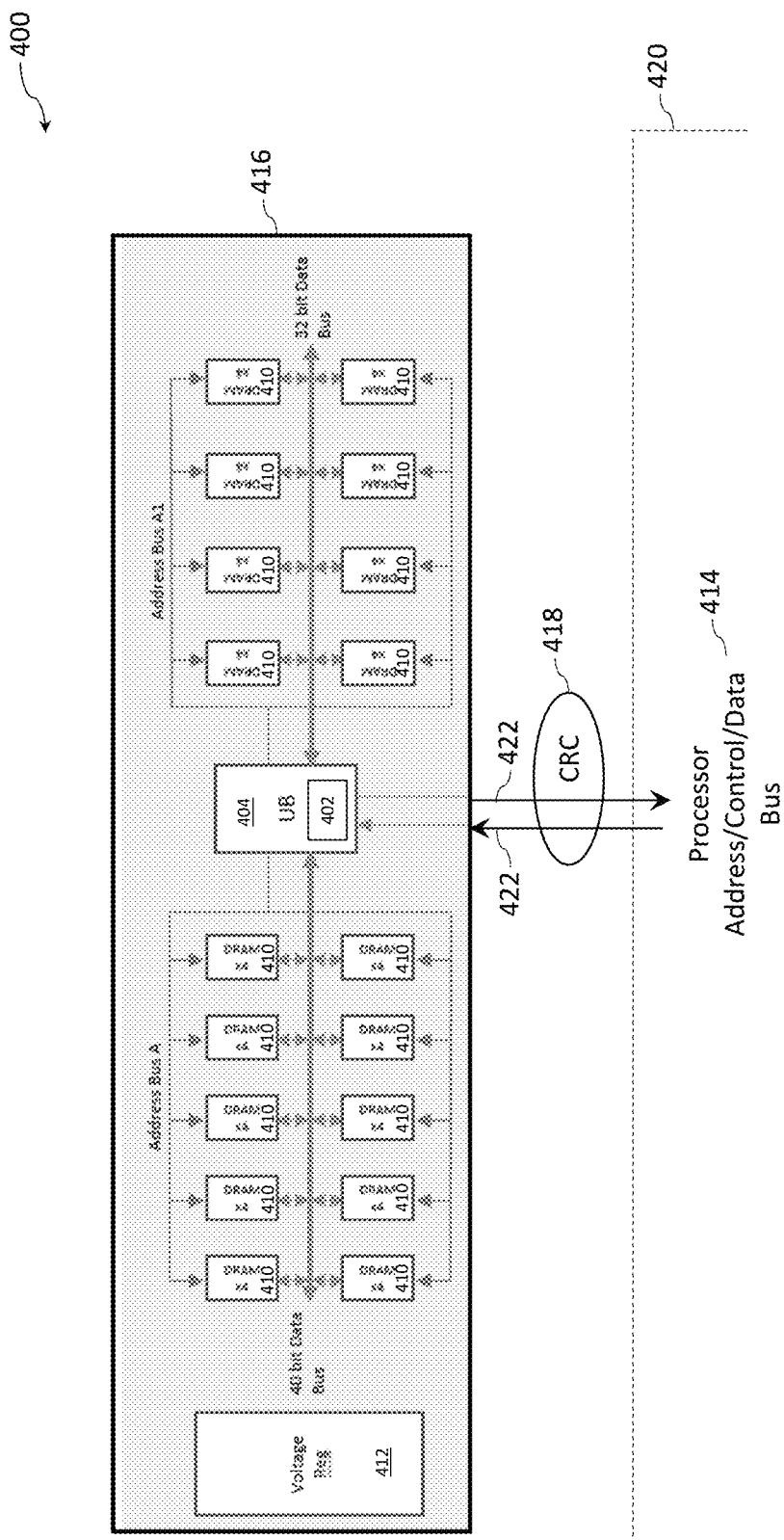
FIG. 4 depicts a block diagram of a system that includes a unified memory buffer in accordance with one or more embodiments of the present invention.

Turning now to FIG. 4, a block diagram of a memory system 400 that includes a memory subsystem 416 with a unified memory buffer 404 is generally shown in accordance with one or more embodiments of the present invention. The memory subsystem 416 shown in FIG. 4 includes DRAMS 410, a voltage regulator 412, and a unified memory buffer 404. The unified memory buffer 404 shown in FIG. 4 includes a CRC control module 402 for performing all or a subset of the CRC processing described herein. The CRC control module 402 may also include one or more registers for storing CRC related data such as, but not limited to, a CRC trace buffer, a CRC rate and an identifier of CRC type(s) currently being used. Logic (e.g., CRC control module 402) to perform a CRC check and logic to compare multiple CRC results and to perform detailed analysis/fault isolation as described herein are located in and/or executed by both the memory subsystem 416 and processor 420. FIG. 4 includes a bi-directional interface address/control/data channel 422 that uses CRC 418 (which may include one or more types of CRCs being applied in parallel) for error detection. In an embodiment, address/control/data channel 422 is implemented as two unidirectional buses (one bus in each direction, each bus checked with CRC). In an embodiment address/control/data channel 422 is implemented as a bi-directional bus, with CRC checking in each direction. The address/control/data channel 422 is used to transmit address and control information between the unified memory buffer 404 and an address/control/data bus 414 on the processor 420 (e.g., host computer or memory controller). A pair of CRC control modules 402 (one on the unified memory buffer 404 and the other on the processor 420 can be used to synchronize, or coordinate, detailed fault analysis/fail isolation, as well as CRC rates and types across the address/control/data channel 422. In an embodiment of the present invention, the address/control/data channel 422 includes eight lanes in each direction with the data and address/control lanes combined. In the memory subsystem 416 shown in FIG. 4, CRC protection may be required for all of the frames of data bits.

In an embodiment, frames to be transmitted can be arranged in an eight-bit by eight-bit matrix in a system where eight high-speed lanes each convey eight beats of information down a channel. Thus, in this example each frame transmission is capable of sending a maximum of sixty-four bits of payload. If the payload is made up of sixty-four bytes of data, then eight such frames would need to be transferred. If the channel is running in a high performance application at, for example, ten Gigabits per second (Gbps), then the sixty-four bytes would be transmitted in 6.4 nanoseconds (ns). However, the payload as described would be unprotected and exposed to error. A common protection scheme includes embedding some number of CRC bits in each frame. For example, an eleven bit CRC can provide the ability to detect most types of errors on any of the eight lanes however, the addition of CRC bits reduces the payload space to fifty-three bits in each packet. The addition of eleven CRC bits requires an additional two frames to deliver all sixty-four bytes, which increases the delivery time of that same data from 6.4 ns to 8 ns. Improved error rate detection and error isolation is possible by using more robust CRC codes which can consume thirty or more bits per frame which would cut the data bandwidth almost in half.

Figure 5:
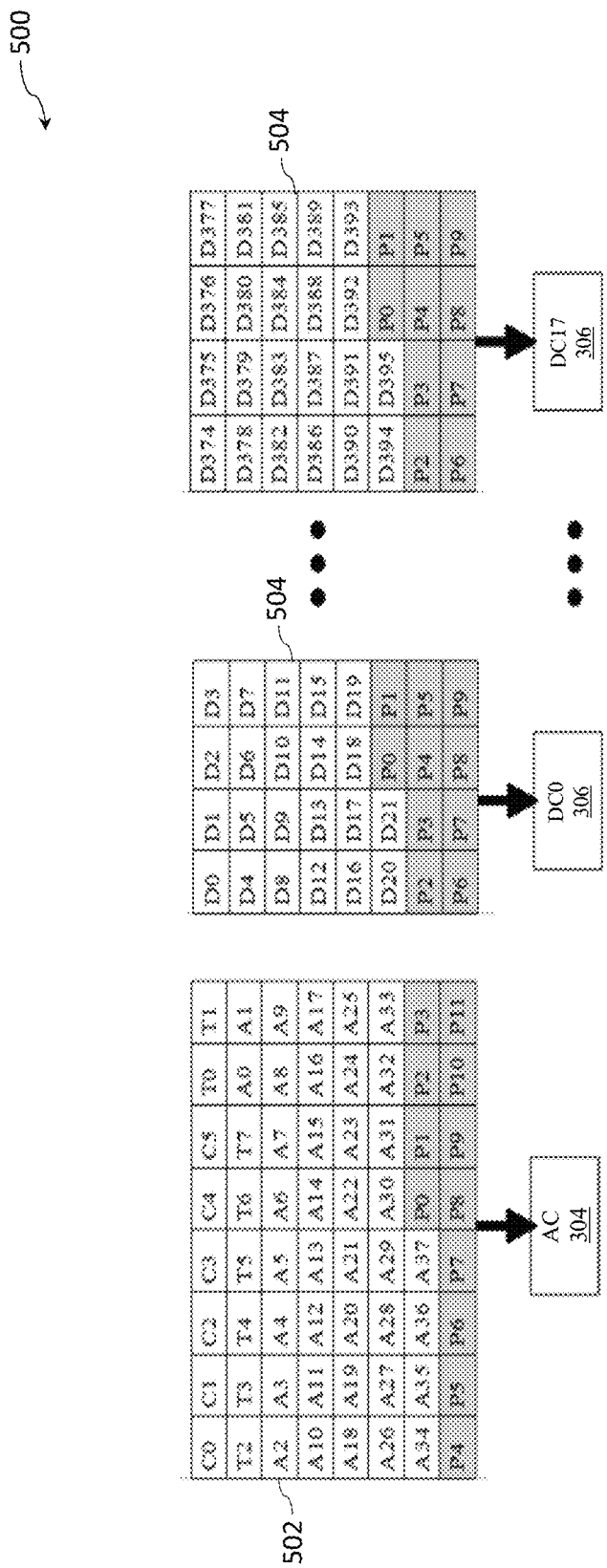
FIG. 5 depicts a distributed memory buffer structure that implements cyclic redundancy (CRC) protected eight beat frames in accordance with one or more embodiments of the present invention.

Turning now to FIG. 5, a distributed memory buffer structure 500 that implements CRC protected eight beat frames is generally shown in accordance with one or more embodiments of the present invention. The distributed memory buffer structure 500 shown in FIG. 5 includes an address/command buffer 502 that is eight bits wide and has eight rows (beats), and that interfaces to an AC, such as AC 304 in FIG. 3. The address/command buffer 502 shown in FIG. 5 includes six command bits (labeled C0-C5), eight response bits (labeled T0-T7), thirty-eight address bits (labeled A0-A37) and twelve CRC bits (labeled P0-P11). The distributed memory buffer structure 500 shown in FIG. 5 also includes eighteen data buffers 504 that each are four bits wide and have eight rows (beats), and that interface to DCs, such as DCs 306 in FIG. 3. The data buffers 504 shown in FIG. 5 each include twenty-two data bits (labeled D0-D21 and D374-D396), and ten CRC bits (labeled P0-P9). The CRC bits shown in FIG. 5 consume space in the frames that could be used for additional command, address, response, and/or data payload bits.

Figure 6:
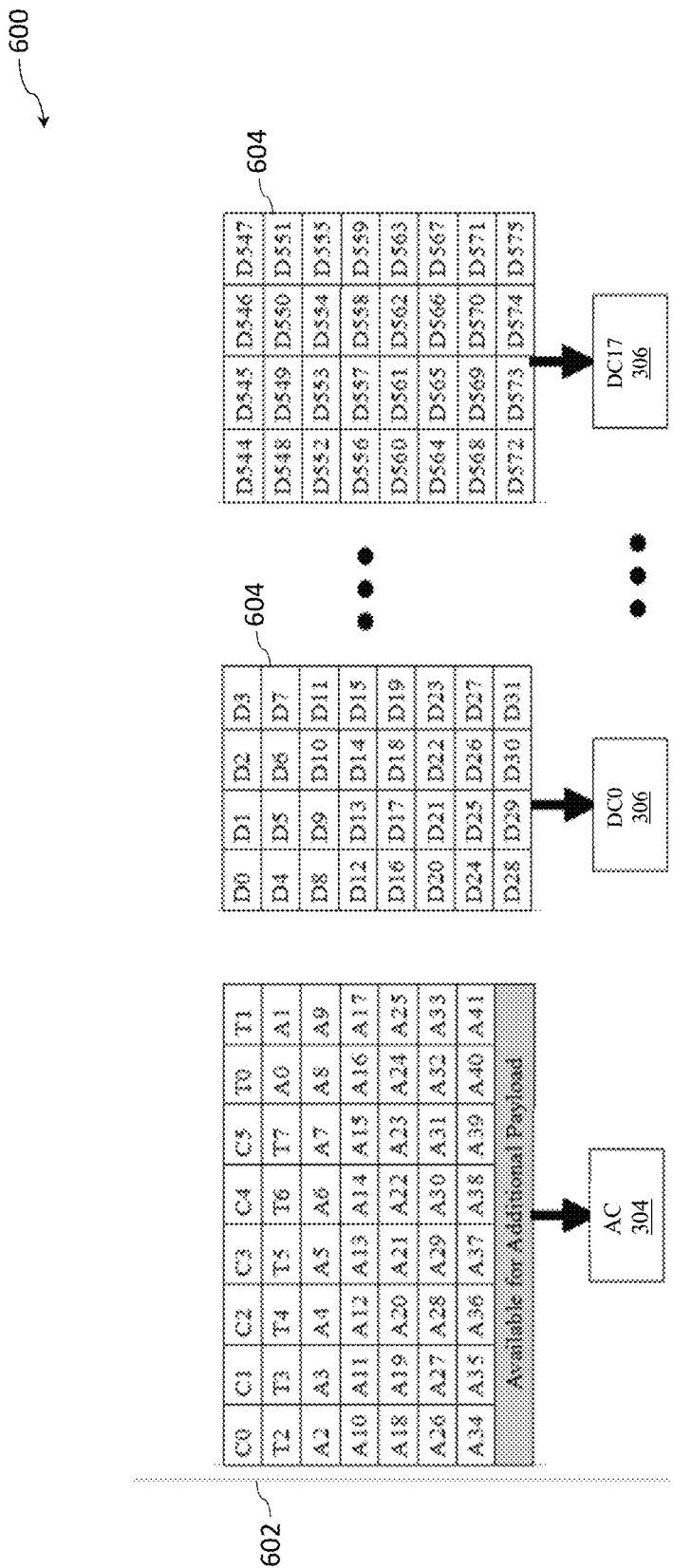
FIG. 6 depicts a distributed memory buffer structure that implements payload only frames in accordance with one or more embodiments of the present invention.

Turning now to FIG. 6, a distributed memory buffer structure 600 that implements payload only eight beat frames is generally shown in accordance with one or more embodiments of the present invention. The distributed memory buffer structure 600 shown in FIG. 6 includes an address/command buffer 602 that is eight bits wide and has eight rows (beats), and that interfaces to an AC, such as AC 304 in FIG. 3. The address/command buffer 602 shown in FIG. 5 includes six command bits (labeled C0-C5), eight response bits (labeled T0-T7), forty-two address bits (labeled A0-A41) and eight bits available for additional payload. The distributed memory buffer structure 600 shown in FIG. 6 also includes eighteen data buffers 604 that each are four bits wide and have eight rows (beats), and that interface to DCs, such as DCs 306 in FIG. 3. The data buffers 604 shown in FIG. 6 each include thirty-two data bits (labeled D0-D31 and D544-D575). The distributed memory buffer structure 600 shown in FIG. 6 does not include any CRC bits. This can result in more payload bits being sent. For example, as shown in FIG. 6, five-hundred and seventy-six data bits can be transferred in the same number of frames as the three-hundred and ninety-six data bits shown in the distributed memory buffer structure 500 of FIG. 5.

In accordance with one or more embodiments of the present invention, upon initializing the communication channel between a transmitter and a receiver, the interface may be programmed with a payload sequence that includes an eight to one ratio, meaning that eight payload-only frames can be transmitted before sending a ninth frame that includes CRC bits. During the initialization process, a common reference point can be established as the basis for counting frames. As long as the communication channel remains error free, this allows sixty-four bytes of data to be transmitted in the minimum required time using an eight-by-eight frame. Referring to the aforementioned eight-by-eight frame structure, this would allow for a sixty-four bit CRC to occupy the ninth frame. Such a code can be extremely robust, providing protection for up to thirteen bit errors, any odd error pattern, and any burst of errors shorter than sixty-four. The probability of failing to detect any other type of random event data error pattern can be about $\frac{1}{2}^{63}$. This exemplifies the potential for allowing high bandwidth bursts of data or transactions while still permitting enterprise level RAS protection.

One or more embodiments of the present invention works in conjunction with positive acknowledge protocols such that anytime a frame is CRC checked, an acknowledge is returned in the opposite direction. This provides continuous feedback to the transmitting side which allows for more efficient use of retry or replay resources which must be allocated to retransmit bad frame sequences. For example, in the absence of an acknowledge, even if the receiving side checks the CRC after every eight payload-only frames, the transmitting side needs to hold on to any subsequent frames until it knows that the time for an error response has passed. If an asynchronous error indication mechanism is used, it can be many more frames of time for the response to reach the transmitter. However, an acknowledge based protocol ensures a guaranteed receipt of an acknowledge within a fixed time, thereby allowing the transmitting side to free up its resources. This concept also pertains to idle frames which are considered payload, so even if a stream of idle frames is being transmitted, the positive acknowledge after the CRC checking allows for potential resource to free up.

Figure 7:
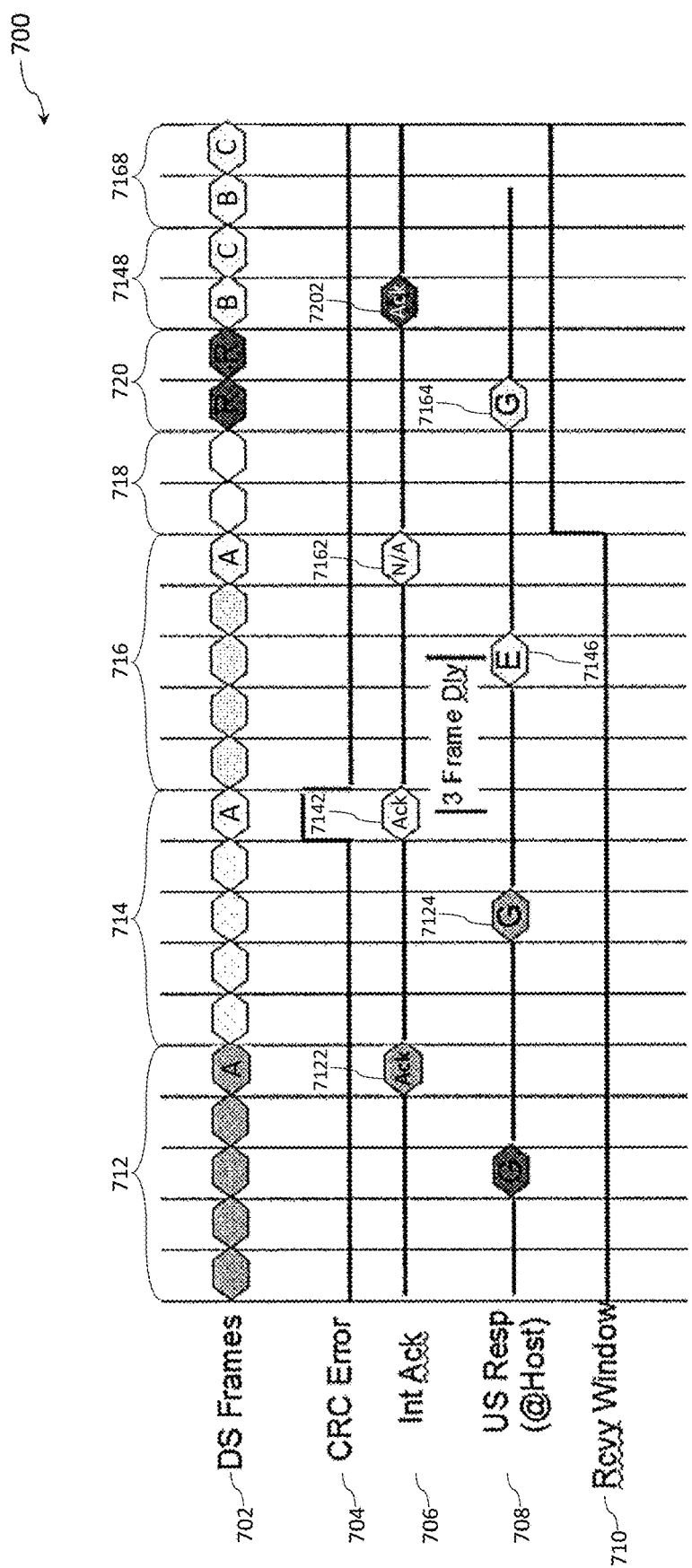
FIG. 7 depicts a timing diagram in a system that utilizes multiple CRCs for optimized fail isolation in accordance with one or more embodiments of the present invention.

Turning now to FIG. 7, a timing diagram 700 in a system that utilizes multiple CRCs for optimized fail isolation is generally shown in accordance with one or more embodiments of the present invention. The example shown in FIG. 7 can be implemented by a host that sends downstream frames to a receiver using a payload sequence that includes a four-to-one payload to CRC ratio. In accordance with one or more embodiments of the present invention, the default CRC (denoted "A" in FIG. 7) is optimized for maximum detection of any frame having fails in the payload sequence. The downstream frames 702 in the timing diagram 700 of FIG. 7 include payload sequence 712, payload sequence 714, and payload sequence 716 each including four payload bit only frames and one frame that includes CRC bits along with payload bits (or optionally just CRC bits). As shown in FIG. 7, the CRC check frames assert internal acknowledges 706 indicating an acknowledge, "Ack", or no acknowledge, "NA" which are eventually delivered back to the host as an upstream response 708 indicating either a "good" transmission or a CRC error. In the example of FIG. 7, payload sequence 712 asserts internal acknowledge 7122, and three frames later receives upstream response 7124 (denoted by a good status, "G") indicating that payload sequence 712 was received by the receiver without CRC errors. Also shown in FIG. 7 is payload sequence 716 which asserts internal acknowledge 7162, and three frames later receives upstream response 7164 (denoted by a good status, "G") indicating that payload sequence 716 was received by the receiver without CRC errors.

Further shown in FIG. 7 is payload sequence 714 which asserts internal no acknowledge 7142, and three frames later receives upstream response 7146 (denoted by error status, "E") indicating that the receiver detected a CRC error when receiving payload sequence 714. Upon receipt of a CRC error and after payload sequence 716 has completed transmission to the receiver, the host enters a recovery window 710. In the recovery window 710 the sending of downstream frames by the host is paused as shown by the empty time slots 718 and recovery window frames 720 are sent to the receiver. The recovery window frames 720 instruct the receiver to stop the normal CRC checking and to begin a fail detection process. As shown in FIG. 7, additional CRC bits 7148 "B" and "C" calculated by the host based on payload sequence 714 are sent to the receiver, followed by additional CRC bits 7168 B and C calculated by the host based on payload sequence 716 are sent to the receiver. In the example shown in FIG. 7, there is a seven frame lag between receiving the upstream response 708 with an error indication 7146 and sending downstream frames 702 with additional CRC bits 7148 for additional fail analysis. In accordance with one or more embodiments, any combination of CRC types can be utilized. In one example, A is a frame detect CRC, B is a beat isolation CRC and C is a lane isolation CRC. FIG. 7 also shows an internal acknowledge 7202 for the payload sequence that includes the empty time slots 718, the recovery window frames 720, and the first bit of the additional CRC bits 7148.

Figure 8:
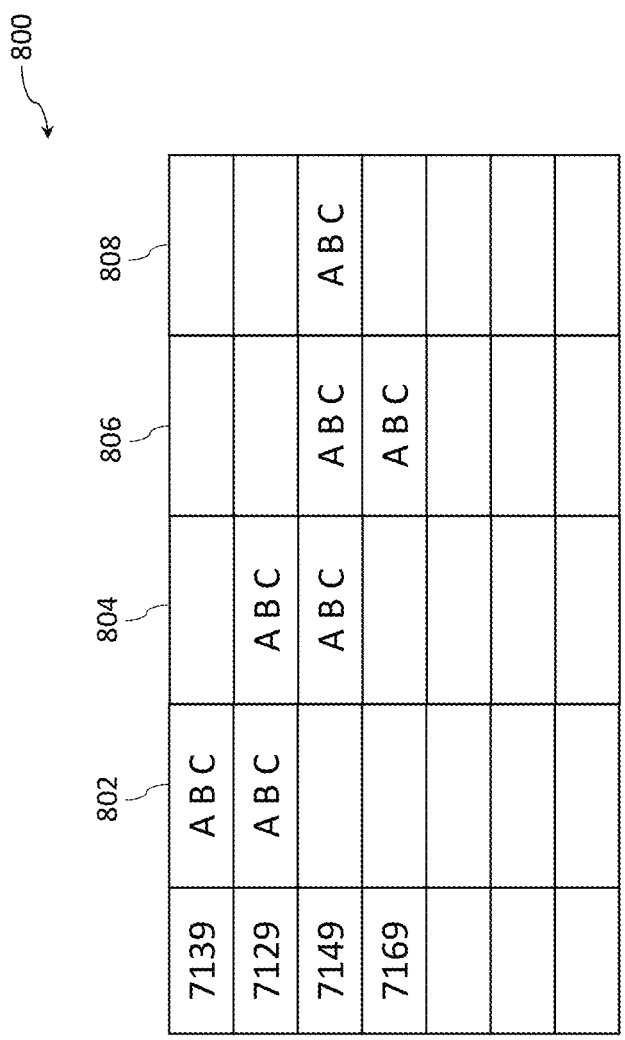
FIG. 8 depicts a trace buffer of a system that utilizes multiple CRCs in accordance with one or more embodiments of the present invention.

Turning now to FIG. 8, a trace buffer 800 of a system that utilizes multiple types of CRCs is generally shown in accordance with one or more embodiments of the present invention. At time 802, which corresponds to the time that payload sequence 712 starts transmitting as shown in FIG. 7, the trace buffer includes CRC bits 7129 for payload sequence 712 of FIG. 7, as well as CRC bits 7139 for a payload sequence that was transmitted prior to payload sequence 712.

At time 804 in FIG. 8, which corresponds to the time that payload sequence 714 starts transmitting as shown in FIG. 7, the trace buffer is no longer tracking CRC bits 7139 due, for example, to receiving an upstream response 708 from the receiver indicating that the receiver did not identify any CRC errors in the payload that was used to the generate CRC bits 7139. At time 804, the trace buffer is still tracking CRC bits 7129 because, for example, as shown in FIG. 7, an upstream response 708 from the receiver for payload sequence 712 has not yet been received by the host. At time 804, the trace buffer also includes CRC bits 7149 for payload sequence 714 which are calculated prior to transmitting payload sequence 714 to the receiver.

At time 806 in FIG. 8, which corresponds to the time that payload sequence 716 starts transmitting as shown in FIG. 7, the trace buffer is no longer tracking CRC bits 7129 because the host has received upstream response 7124 from the receiver indicating that the receiver did not identify any CRC errors in payload 712. At time 806, the trace buffer is still tracking CRC bits 7149 because an upstream response 708 from the receiver for payload sequence 714 has not yet been received by the host. At time 806, the trace buffer also includes CRC bits 7169 for payload sequence 716 which are calculated prior to transmitting payload sequence 716 to the receiver.

At time 808 in FIG. 8, the trace buffer is still tracking CRC bits 7149 because the host has received an upstream response 7146 from the receiver indicating that the receiver detected at least one CRC error in payload sequence 714. Also at time 808, CRC bits 7169 have been retired, or removed, from the trace buffer because the host has received an upstream response 7164 from the receiver indicating that the receiver did not identify any CRC errors in payload 716.

As shown in FIG. 8, in accordance with one or more embodiments of the present invention, the CRC trace buffer 800 tracks the CRC bits for the different types of CRCs for each payload. An entry exists in the CRC trace buffer 800 for each type of CRC being utilized (frame detection, frame isolation, lane isolation, beat isolation, etc.). The depth of the CRC trace buffer 800 at any point in time can be a function of the round trip from when the host sends the full CRC frame, or payload sequence, until it receives a response indicating whether the CRC check encountered an error. Once a positive response is received indicating that no CRC errors were detected, the buffer can retire the associated set of CRC bits for each of the CRC types being tracked. Upon receipt of a CRC error, the host enters a recovery window where it transmits the set of previously calculated CRC bits for each of the CRC types (e.g., A, B, C in the example shown in FIG. 8) associated with the errant payload sequence. The receiving side can then compare these specialized codes with it internally stored copies to discern precisely which payload frame(s) encountered the error.

This information can be relayed back to the host to perform actions such as, but not limited to: determine which operational sequences to retry; perform lane sparing; change the payload-to-CRC ratio; and/or adjust the CRC types.

In an alternate embodiment, upon receipt of a CRC error, the host can enter a recovery window where it requests the receiver to send information. The type of failing frame information that can be sent back to the transmitter can vary and is implementation specific. In an embodiment, the receiving side sends a simple coded response to the transmitting side telling it which CRC (A, B, C) had the problem along with either the raw CRC that was received or the failing syndrome. Since the transmitting side has its own copies of A, B, and C3, once the transmitter knows which one indicates an error, it can work on debug and isolation of the error. The transmitter can include hardware running on the transmitting side or firmware/software failure analysis routines. An advantage to this approach is that it keeps one side (e.g., a device) relatively low cost and simplistic and it puts all of the debug and error isolation processing on the other side (e.g., a host). In an embodiment, where the receiving side is a device and the transmitting side is a host, the device can either directly send back the coded response, or it can send back a simple "generic" fail response (or interrupt) and store the failing code in a trap error register that the host (or firmware/software) can interrogate as part of handling the error/interrupt.

Figure 9:
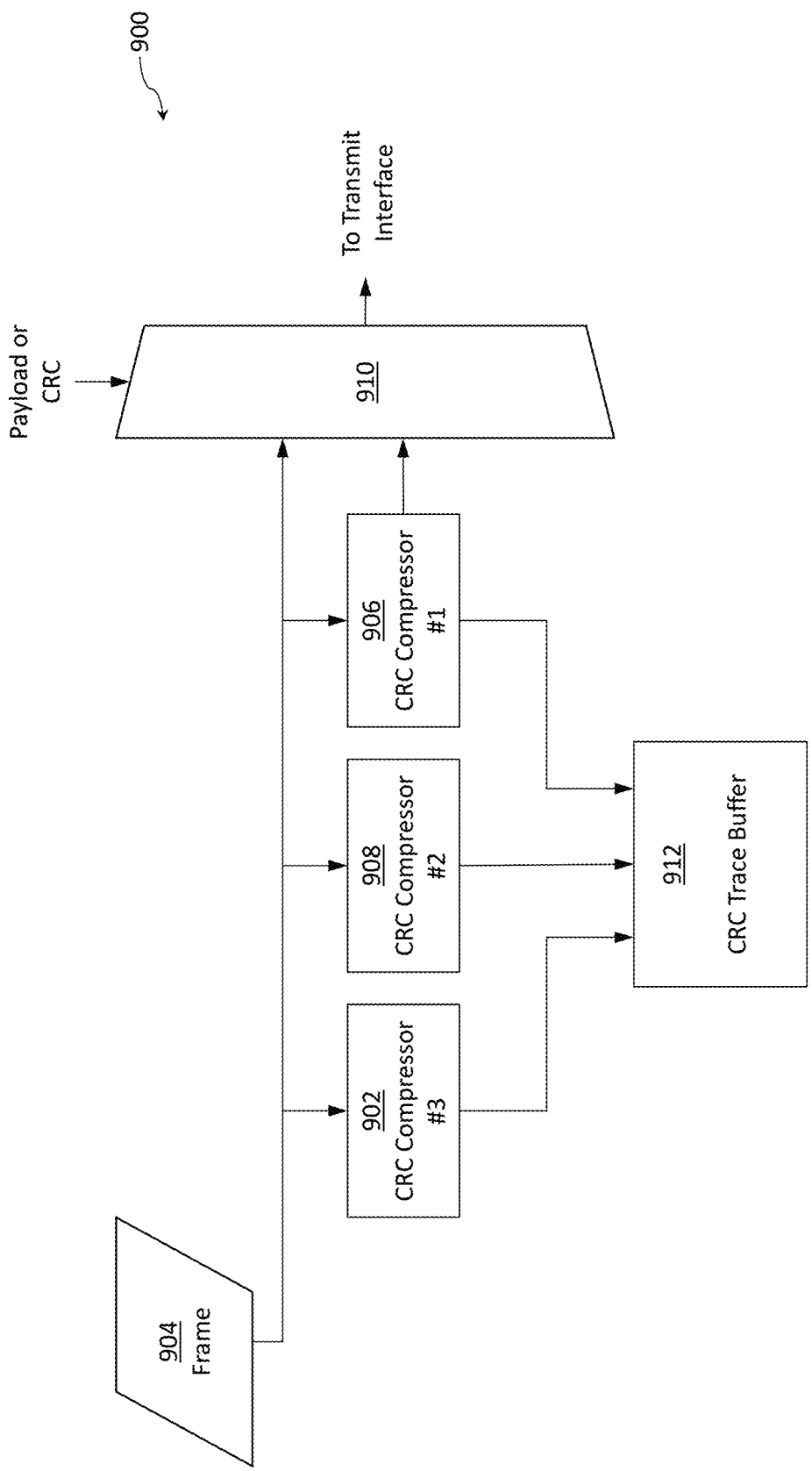
FIG. 9 depicts a flow diagram of transmit circuitry in a system that utilizes multiple CRCs in accordance with one or more embodiments of the present invention.

Turning now to FIG. 9, a flow diagram 900 of CRC transmit circuitry in a system that utilizes multiple CRCs is generally shown in accordance with one or more embodiments of the present invention. The processing shown in FIG. 9 can be performed by CRC control circuitry such as CRC control module 302 in FIG. 3 or CRC control module 402 in FIG. 4. The frame 904 includes payload content that is to be transmitted across a communication channel. Each of CRC compressor 902 908 906 can be associated with a different type of CRC. The CRC compressors 902 908 906 each calculate CRC bits (source CRC bits) for the frame for their corresponding type of CRC and store them in a CRC trace buffer 912 (e.g., CRC trace buffer 800 of FIG. 8). The CRC compressors 902 908 906 determine the types of CRC to be applied to the payload in the frame 904 and they keep track of what data bits to include when generating the source CRC bits (e.g., payload from all frames since last frame with CRC bits, current frame, etc.). The source CRC bits calculated by one of the CRC compressors, in this example CRC compressor 906, are input to multiplexor 910 which adds them into a frame for transmission to a receiver across a communication channel when the signal PAYLOAD_OR_CRC is set to indicate that the CRC bits should be added to the frame. Otherwise, the multiplexor 910 transmits a frame containing payload-only data to the transmission interface for transmission across a communication channel to a receiver.

Figure 10:
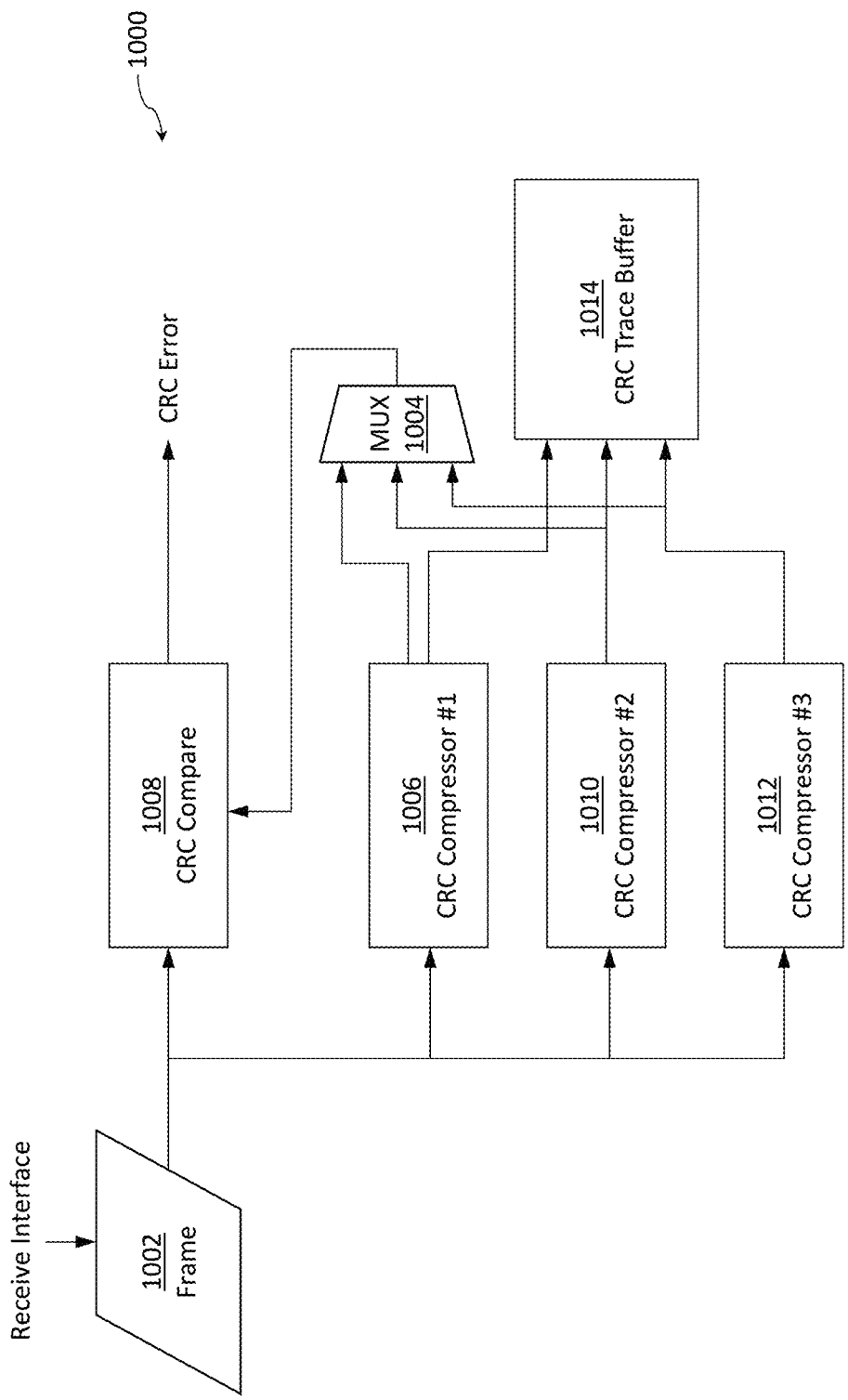
FIG. 10 depicts a flow diagram of receive circuitry in a system that utilizes multiple CRCs in accordance with one or more embodiments of the present invention.

Turning now FIG. 10, a flow diagram 1000 of CRC receive circuitry in a system that utilizes multiple CRCs is generally shown in accordance with one or more embodiments of the present invention. The processing shown in FIG. 10 can be performed by CRC control circuitry such as CRC control module 302 in FIG. 3 or CRC control module 402 in FIG. 4. A frame 1002 is received at an interface on a receiver. The frame is sent to CRC compressors 1006 1010 1012 where CRC bits (calculated CRC bits), are calculated based on payload bits in the frame 1002. Each compressor 1006 1010 1012 calculates CRC bits for the frame for their corresponding type of CRC and stores them in a CRC trace buffer 1014 (e.g., CRC trace buffer 800 of FIG. 8). The CRC compressors 1006 1010 1012 determine the types CRCs to be applied to the payload in the frame 1002 and they keep track of what data bits to include when generating the calculated CRC bits (e.g., payload from all frames since last frame with CRC bits, current frame, etc.). In an embodiment, a multiplexor 1004 is used to select one or more of CRC compressors 1006 1010 1012 for comparison. Multiplexor 1004 output is compared to source CRC found in frame 1002 by CRC compare 1008. The CRC bits calculated (actual) by one of the CRC compressors, in this example CRC compressor 1006, are compared, by CRC compare 1008, to the source CRC bits extracted from the frame 1002. If the source CRC bits are not the same as the calculated CRC bits, then an error signal (e.g., CRC_ERROR) is output to the host, or transmitting side.

In accordance with one or more alternate embodiments of the present invention, rather than storing CRC bits for multiple types of CRCs for each frame as they are generated, compressors are used on both the transmitting and receiving sides to generate a composite group of CRC bits that reflect the two or more CRC types. At an infrequent rate, a composite group of CRC check bits is sent to be compared to the composite group of CRC check bits generated by corresponding CRC control circuity on the other side of the communication channel. If no errors are detected, the compressors can be reset to begin compressing a new sequence of frames. If an error is detected, an indication is sent to the transmitting side which enters a recovery window. All of the composite groups of CRC check bits are then transmitted to be compared on the receiving side to the receiving side copies of the composite groups of CRC check bits. The mismatched groups of CRC check bits can then be analyzed to isolate exactly what failed. Depending on the type of fail (frame, lane, etc.) different recovery policies can be employed.

As described herein, one or more embodiments use CRC trace buffers at both the transmitting and receiving sides to continually store the set of CRCs (e.g., three different CRC types). Only one of the codes is normally used for checking. Once it's determined back at the transmitter that the payload arrived safely, the entire set of codes pertaining to that payload can be retired out of the trace buffer on the transmitter to free up space for new codes. Since there is a round trip delay time for the receiving side to check the one CRC code that was sent, to determine that there are no errors, to send back a good acknowledge to the host, travel time for the host to receive and interpret the acknowledge, this means that at any point in time the trace buffer will typically hold several payload's worth of codes. Then if there is an error, the host sends down the full set of codes for each payload. An advantage of this type of embodiment is that it can be determined exactly which payload failed because a full set of codes is available for every payload. This advantage is balanced with the need to have trace arrays on both sides to manage the trace buffers (track the entries, retire the good ones, etc.).

Figure 11:
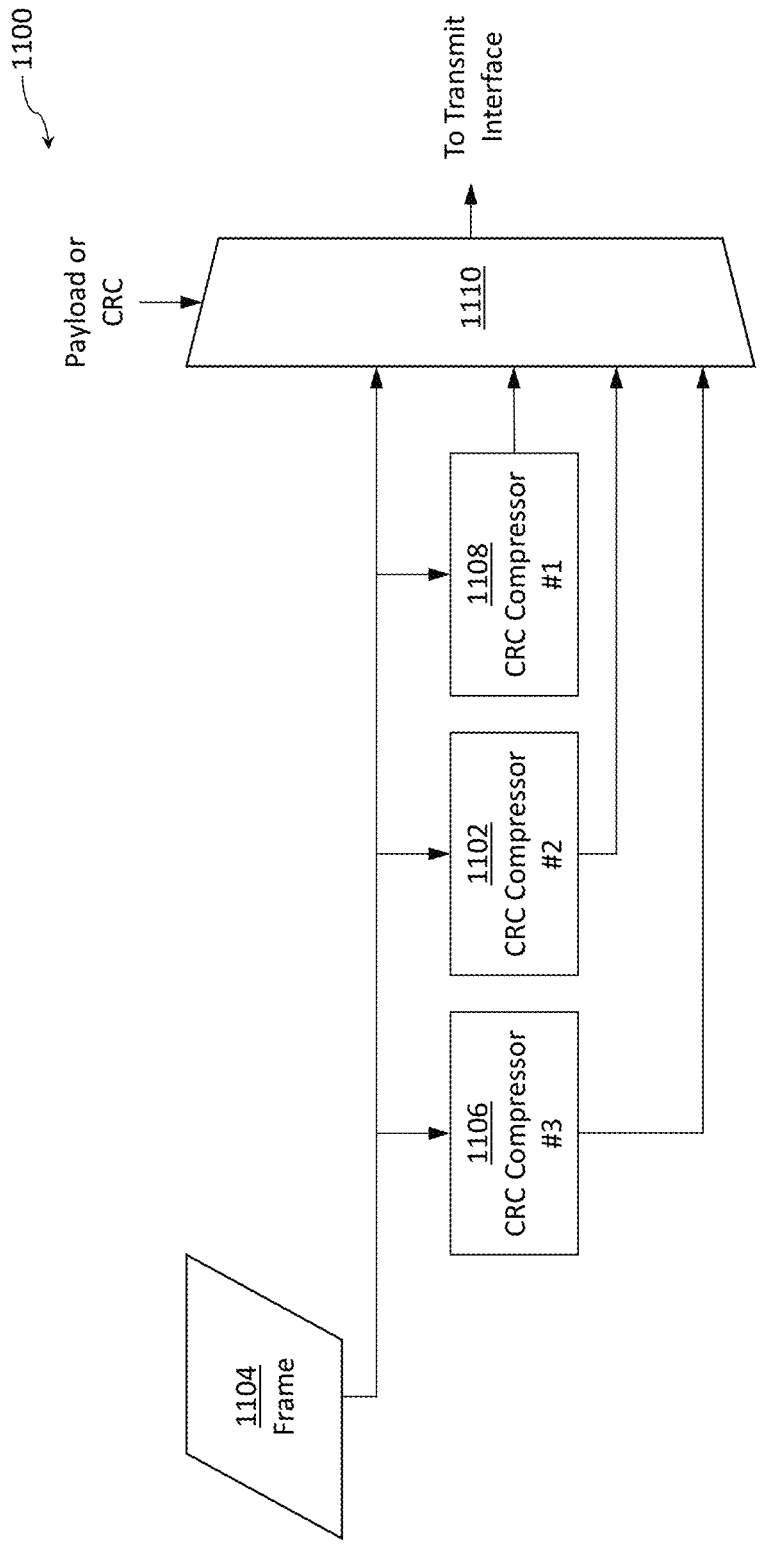
FIG. 11 depicts a flow diagram of transmit circuitry in a system that utilizes multiple CRCs in accordance with one or more embodiments of the present invention.

Turning now FIG. 11, a flow diagram 1100 of transmit circuitry in a system that utilizes multiple CRCs is generally shown in accordance with one or more embodiments of the present invention. The processing shown in FIG. 11 can be performed by CRC control circuitry such as CRC control module 302 in FIG. 3 or CRC control module 402 in FIG. 4. The frame 1104 includes payload content that is to be transmitted across a communication channel. Each of CRC compressor 1106 1102 1108 can be associated with a different type of CRC. The CRC compressors 1106 1102 1108 each calculate CRC bits for the frame for their corresponding type of CRC based on the payload of each frame 1104. The calculated CRC bits are input to multiplexor 1110 which adds them into a frame for transmission to a receiver across a communication channel when the signal PAYLOAD_OR_CRC is set to indicate that the CRC bits should be added to the frame. Otherwise, the multiplexor 1110 transmits a frame containing payload-only data to the transmission interface for transmission across a communication channel to a receiver.

In accordance with one or more embodiments of the present invention, a composite of the calculated CRC bits is input to multiplexor 1110.

Figure 12:
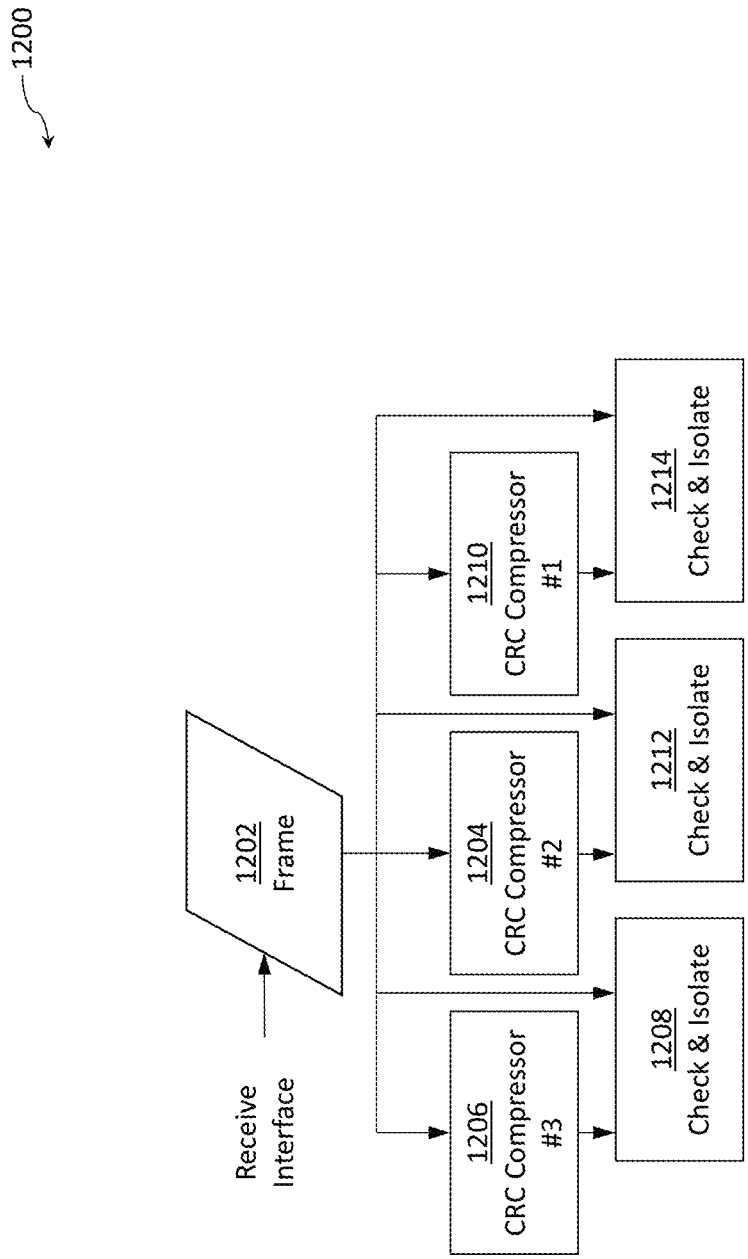
FIG. 12 depicts a flow diagram of receive circuitry in a system that utilizes multiple CRCs in accordance with one or more embodiments of the present invention.

Turning now to FIG. 12, a flow diagram 1200 of receive circuitry in a system that utilizes multiple CRCs is generally shown in accordance with one or more embodiments of the present invention. The processing shown in FIG. 12 can be performed by CRC control circuitry such as CRC control module 302 in FIG. 3 or CRC control module 402 in FIG. 4. A frame 1202 is received at an interface on a receiver and CRC bits, if any, are extracted from the frame 1202 and input to check and isolate modules 1208 1212 1214. The frame 1202 is also sent to CRC compressors 1206 1204 and 1210 where CRCs are calculated based on payload bits in the frame 1202. Each compressor 1206 1204 1210 calculates CRC bits for the frame for their corresponding type of CRC and outputs them to corresponding check and isolate modules 1208 1212 1214. The CRC compressors 1208 1212 1214 determine the types CRCs to be applied to the payload in the frame 1202 and they keep track of what data bits to include when generating the CRC bits (e.g., payload from all frames since last frame with CRC bits, current frame, etc.).

In accordance with one or more embodiments, the check and isolate modules 1208, 1212, and 1214 will first compare the incoming source CRC from the frame 1202 with the calculated CRC values in compressors 1206, 1204 or 1210 to determine whether the CRC and/or frame data was received without errors. If the received source CRC in frame 1202 matches the selected calculated CRC value in receiver compressor 1206, 1204, or 1210, then there is no error and recovery and isolation are not needed. On the other hand, if the received source CRC from frame 1202 does not match the corresponding CRC from CRC compressor 1206, 1204, or 1210, recovery and/or isolation can be performed. In an embodiment, recovery involves the steps of notifying the host, or transmitter, that there was an error. The host determines, based on timings of the error status, which frame or frames need to be resent. The list of failing frames (via an IDs or tags) can be communicated to the host. In an embodiment, the comparison of the receiver CRCs versus the received CRCs (using e.g., a bitwise XOR) determine a "syndrome" that can be used for isolation. The list of particular syndromes map to a list of particular lanes, frames, cycles, beats, or other isolations.

As described herein, one or more embodiments of the present invention take the approach of using infrequent compression, where the payload is continually compressed and at some specified rate one of the CRC codes is sent to the receiver. The compression (or composite CRC) does not use fewer bits, however it contains more history of past packets transmitted than a CRC that is not a composite CRC. The receiving side checks the CRC and as long as no errors have been detected, the transmitter can reset the compression and start over again. However, if there is an error, an error indicator is sent back to the transmitter and the transmitter then goes into a recovery window where it sends down the full set of codes (e.g., three different CRCs) that it has been continually compressing. The receiving side also has a similar set of compressors for all the codes so it's able to compare all three codes. The check and isolate boxes 1208, 1212, and 1214 in FIG. 12 compare the CRCs that were calculated in the CRC compressors 1206, 1204, and 1210 against the CRC codes that were received from the transmitting side. If a comparison results in a CRC match, then that code is not useful for debugging the current error. If the CRC mismatches, then a syndrome that can isolate the fail has been identified. For example, if the failing CRC is a code that is specific to lane isolation, then the syndrome will determine the failing lane. If the code is specific to frame isolation, then the syndrome will determine the failing frame, and so on. In most cases the comparison will be in hardware, however the actual syndrome analysis can be performed in hardware or in firmware/software. The decision about where to perform the analysis can depend on the application and how quickly the analysis needs to be completed.

As described herein, in accordance with one or more embodiments, multiple codes are compressed on the driving side, one or more CRCs are sent to the receiving side (in numerous variations), and the CRC is checked on the receiving side. How often the various CRC codes are sent and how/when the compressors get reset can vary based on implementation requirements. In an embodiment, a first CRC is sent until a first error is detected. During the time until a first error is detected, the other compressors continue to compress and build a history. Then when the first error is detected, all of the remaining codes can be sent at once for checking/isolation. Alternatively, when the first error is detected, a round robin can be employed to switch from code A to code B, etc.

An advantage to an embodiment of the present invention that utilizes CRC compressors is that trace arrays and the managing of array entries is not required. This is balanced with requiring both sides to have multiple matching compressors, and not being able to isolate exactly which payload has the error.

Figure 13:
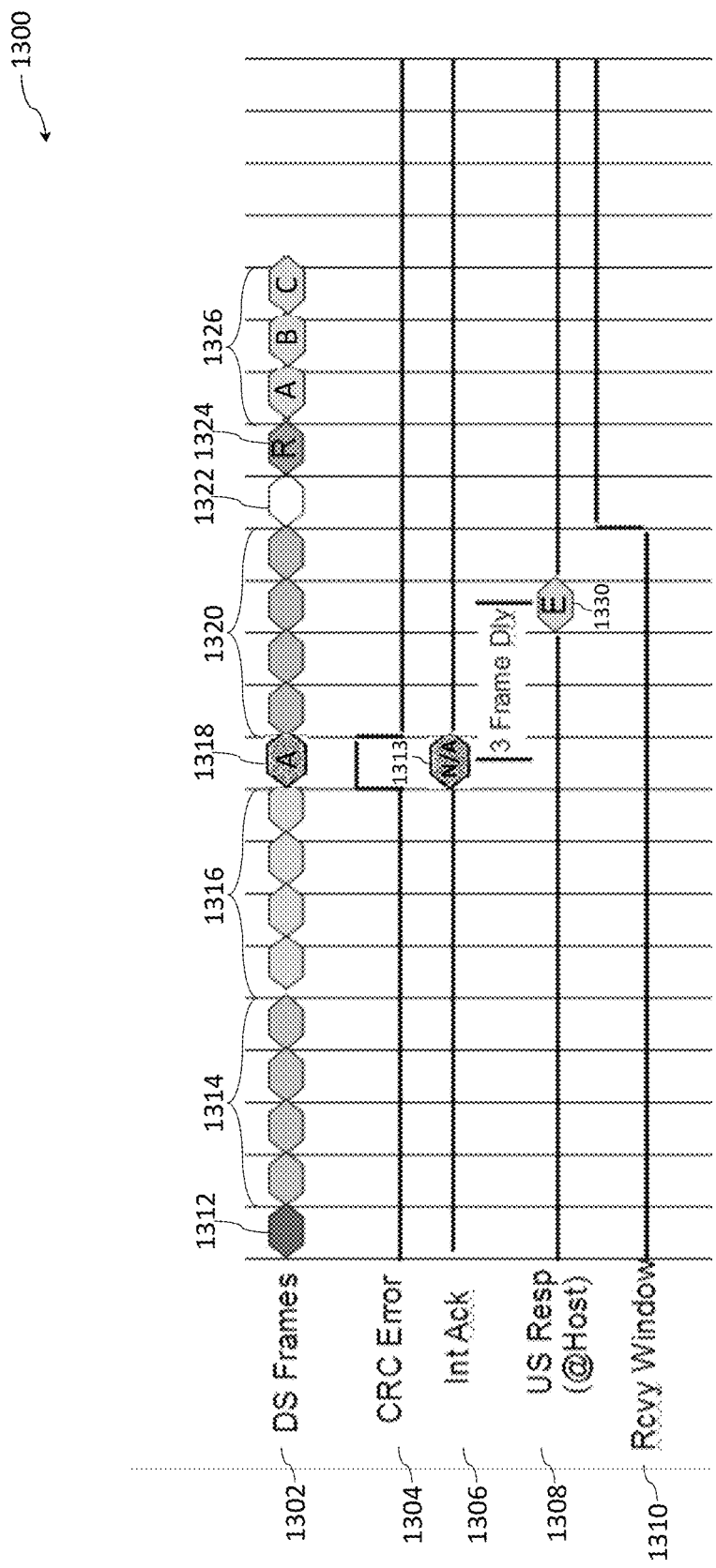
FIG. 13 depicts a timing diagram in a system that utilizes multiple CRCs in accordance with one or more embodiments of the present invention.

Turning now to FIG. 13, a timing diagram 1300 in a system that utilizes multiple CRCs is generally shown in accordance with one or more embodiments of the present invention. The example shown in FIG. 13 can be implemented using the transmit circuitry of FIG. 11 and the receive circuitry of FIG. 12. The timing diagram 1300 shown in FIG. 13 includes timings for downstream frames 1302, detection of a CRC error 1304, internal acknowledgements 1306, upstream responses 1308, and entry into a recovery window 1310. As shown in FIG. 13, downstream frames 1302 that include payload only frames 1312, payload only frames 1314, and payload only frames 1316 are sent to the receiver followed by CRC check frame 1318 which contains CRC bits for a CRC of type "A". In accordance with one or more embodiments of the present invention, CRC check frame 1318 includes composite CRC bits that are calculated based on payload only frames 1312 1314 and 1316. As shown in FIG. 13, the CRC check frame 1318 is used to check the integrity of frames 1312 1314 and 1316. If there is a CRC Error 1304 active, then internal acknowledge 1313 is not acknowledged "NA" and asserts an error response 1330 denoted as "E" to be delivered back to the host in response to the internal not acknowledge 1313 "NA". The error response 1330 indicates that the receiver detected a CRC error when receiving payload sequences 1312 1314 and 1316. After receipt of the error response 1330 and after payload only sequence 1320 has completed transmission to the receiver, the host enters the recovery window 1310. In the recovery window 1310 the sending of downstream frames by the host is paused as shown by empty time slot 1322, and a recovery window frame 1324 is sent to the receiver. The recovery window frame 1324 instructs the receiver to stop the normal CRC checking and to begin a fail detection process. As shown in FIG. 13, additional CRC check frames 1326 that contain composite CRC bits are sent to the receiver. As shown in FIG. 13, the additional CRC check frames 1326 include previously calculated composite check frames for CRCs of type "A", "B", and "C".

Figure 14:
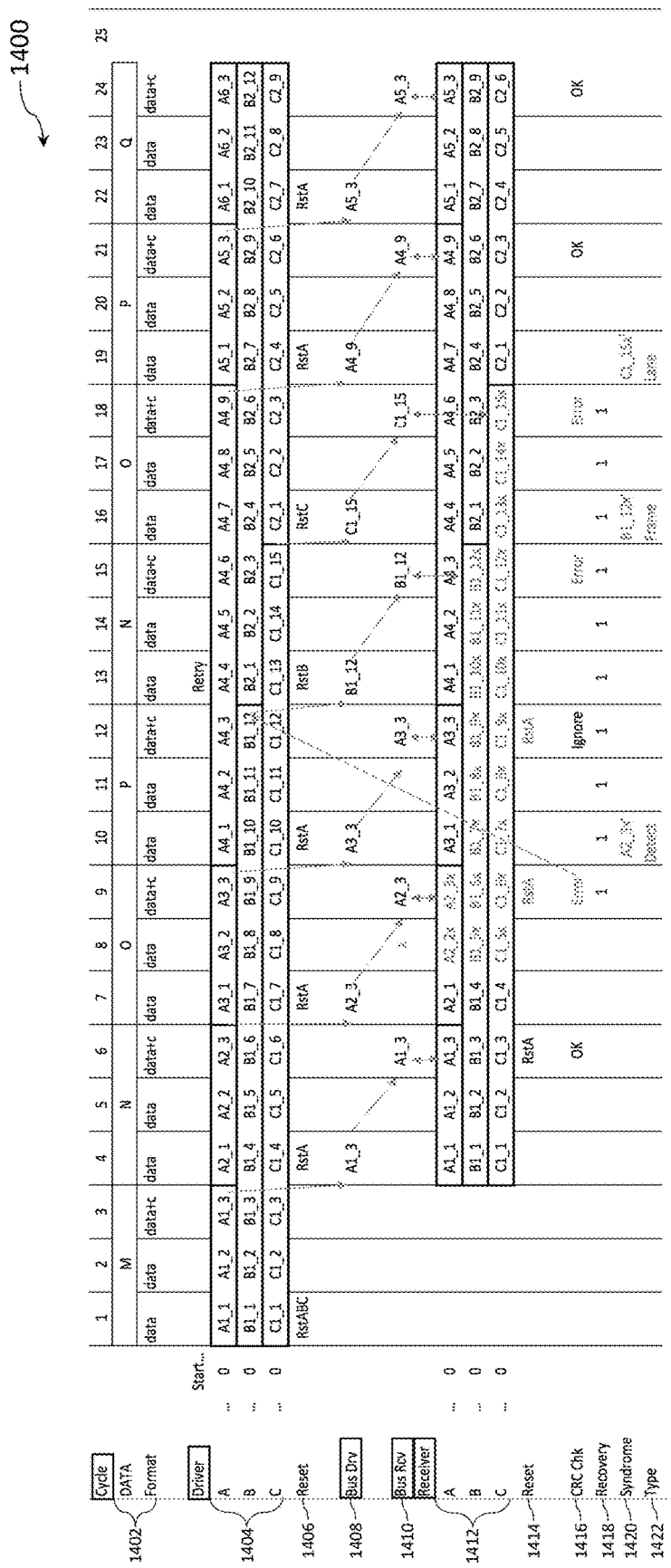
FIG. 14 depicts a timing diagram in a system that utilizes multiple CRCs for optimized fail isolation in accordance with one or more embodiments of the present invention.

Turning now to FIG. 14, a timing diagram 1400 of a system that utilizes multiple CRCs for optimized fail isolation is generally shown in accordance with one or more embodiments of the present invention. The horizontal scale in the timing diagram 1400 represents time, which is depicted as cycles, or frames, 1 through 25. In reference to FIG. 14, the terms cycle and frame are used synonymously. Data 902 are shown as payload sequences 1402, namely M, N, O, P, and Q. Note that payload sequences M and Q are sent just once, while other payload sequences, N, O, and P, are resent as a result of a recovery action, which is described in more detail below. In an embodiment, when a payload sequence transfer arrives with an error (for instance the first transfer of payload sequence N), all subsequent payload sequences are required to be resent, in order, even though not all of them failed (e.g. payload sequences O and P are resent, even though O CRC was clean, as indicated by A3_3=A3_3 on cycle 12).

FIG. 14 also shows contents of CRC stations (also referred to herein as compressors), on a driver, or transmitter, for multiple CRC types 1404 (labeled A, B, and C) as well as a reset condition 1406 for when stations for A, B, and/or C are reset. Also shown are contents of CRC stations on a receiver for multiple CRC types 1412 (labeled A, B, and C) as well as a reset condition 1414 for when A, B, and/or C stations are reset. Since there is a bus connecting the driver to the receiver, shown also is the contents of bus driver 1408 and bus receiver 1410, on either side of the bus, connecting the driver to the receiver. In this embodiment, the bus delay is two cycles or frames. While data packet sequences are assumed to be sent, for simplicity, only the CRC contents are shown on the bus driver 1408 and the bus receiver 1410. FIG. 14 further includes status of a CRC check 1416, recovery status 1418, syndrome 1420, and type 1422.

Turning now to an exemplary payload operation, driver and receiver CRC stations A, B, and C are all reset to zero. Starting at cycle 1, payload sequence M is prepared to be sent from the driver to the receiver. On cycle 1, the cycle 1 part of the data for payload sequence M (i.e., frame 1) are compressed into CRC compressors A, B, and C on the driver side. In an embodiment, compression of frame 1 into driver CRC compressors A, B, and C occurs simultaneously. The result of the compression for cycle 1 into CRC compressors A, B, and C is depicted in FIG. 14 as A1_1, B1_1, and C1_1, respectively. At cycle 2, frame 2 data from payload sequence M are compressed into A, B, and C, yielding A1_2, B1_2, and C1_2, respectively. A1_2, B1_2, and C1_2 reflect content of both frame 1 and frame 2. In an embodiment at cycle 3, when frame 3 of payload sequence M contains data (other than the CRC itself), driver compressors A, B, and C process frame 3 to yield A1_3, B1_3, and C1_3, respectively. A1_3, B1_3, and C1_3 reflect content of frame 1, frame 2 and frame 3. In an embodiment, if frame 3 contains only CRC bits, A1_3, B1_3, and C1_3 may be calculated with zero data for frame 3 of payload sequence M.

In an embodiment, CRC driver stations for A, B, and/or C are reset whenever CRC data is sent from a particular compressor. For example, on cycle 4, after payload sequence M is entirely compressed into CRC compressor A, the value of the compressor (A1_3) is sent onto the bus driver 1408, and, on the same cycle, compressor A is reset and then calculated as the first cycle of payload sequence N (shown as A2_1). It should be noted that in FIG. 14, the CRC compression data are shown using a nomenclature of xy_z, where "x" is A, B, or C, which corresponds to the CRC compressor (and/or compressor type). The second character, "y", corresponds to the CRC compression window. Every time a CRC is sent and reset, a new compression window starts. For example, as shown in FIG. 14, on cycle 4, when CRC compressor A sends A1_3, compressor A resets to zero and starts accumulating frame 4 payload sequence N as a new compression window (window 2) into A2_1. Notice that compressors B and C continue to accumulate frame N data on top of frame M data, as indicated by a continuation of compression window 1 (indicated by B1_4 and C1_4), since CRC compressors B and C do not send any CRC data in cycle 4 nor do they reset. The third character, "z", depicts the frame or cycle number within the compression window for a particular compressor. For example, C1 will compress for 15 cycles before it is reset, denoted by C1_1 through C1_15, before proceeding to C2_1.

Turning back to FIG. 14, A1_3, A2_3, and A3_3 are sent on cycles 4, 7, and 10 (every three cycles) as CRC (type A) for payload sequences M, N, and O, respectively. One or more embodiments of the present invention support numerous different bus latencies. In an embodiment shown in FIG. 14, the latency from the bus driver 1408 to the bus receiver 1410 is two frames or cycles. Therefore, A1_3, A2_3, and A3_3 are received on cycles 6, 9, and 12, respectively. As payload sequence M is sent from the driver to the receiver across the communication channel, receiver CRC compressors A, B, and C begin to compress the data from M. In this example, assume that M is sent and received across the communication channel without any errors. Compressor A will accumulate M, using type A CRC, into A1_1, A1_2, and A1_3 over three cycles, 4, 5, and 6. Notice that, if M arrives without any errors, the CRC receiver compressor 1412 A, cycles 4, 5, and 6, will match the CRC driver compressor 1404 A, cycles 1, 2, and 3. Therefore, when A1_3 arrives at the receiver on cycle 6, a comparison of A1_3 received on the bus identically matches A1_3 as shown in the compressor. The comparison status of the CRC check 1416 is "OK" (i.e. there are no errors detected). Likewise, receiver compressors B and C calculate B1_3 and C1_3, respectively on cycle 6 (the same values the driver calculated from the same data prior to transmission, 3 cycles earlier on cycle 3).

As payload sequence N is sent from the driver to the receiver across the communication channel, receiver CRC compressors A, B, and C begin to compress the data from N into the compressors. In this example, assume that N is sent and received across the communication channel with an error received on cycle 8. This will cause compressor A to calculate A2_2x (rather than the predicted value of A2_2 that the driver calculated on the good data). In this example, errors are indicated by the suffix "x". Likewise, compressors B and C will also calculate values that may differ from the original driver data (B1_5x and C1_5x, respectively). In an embodiment, not all CRC compressors will detect every type of error, so "x" indicates that there may be a miscompare. For many embodiments, all single bit transmission errors are 100% detectable, which is assumed for this example.

On the next cycle, cycle 9, when receiver compressors A, B, and C normally would calculate A2_3, B1_6, and C1_6, the prior errors from cycle 8 will have already corrupted the compressor results, thus yielding A2_3x, B1_6x, and C1_6x, respectively on cycle 9. Therefore, when the received CRC A2_3 is compared to the receiver compressor 1412 A data, A2_3x, a miscompare results, flagging an "error" as shown in CRC check 1416, setting the syndrome 1420 on cycle 10 to A2_3', and the type 1422 on cycle 10 to "detect" to indicate that an error has been detected. In an embodiment, the CRC syndrome 1420 A2_3' is calculated by using an exclusive- or (XOR) of the received bus 1410 A2_3 and the receiver CRC compressor value A2_3x. This error kicks off a recovery action, recovery status 1418 is set to "1", to resend data corresponding to payload sequence N. In an embodiment, the receiver determines that payload sequence M was received without error but payload sequence N had errors. In an embodiment, the driver determines that payload sequence M was received without error but payload sequence N had errors.

Once the received CRC check 1416 "error" in cycle 9 occurs, the host is notified of the error. In an embodiment, the host (driver) is notified of the error through a No Acknowledge (NA) indication on a separate interface bus that goes from the receiver to the driver of this interface. In an embodiment shown, the latency to report the error to the driver takes three cycles, including the time to alter the recovery flow at the driver. On cycle 12, the driver is aware that the A2_3 CRC (frame N) had a miscompare of the CRC information. As a result, in this embodiment, instead of sending A4_3 and resetting CRC compressor 1404 A, the driver logic instead sends CRC code B1_12 and resets compressor 1404 B. The purpose of sending this alternate CRC is to allow the receiver to use the CRC type "B" to help isolate which frame (or frames) had the error. In an embodiment, frame isolation is already established with the detection CRC type A. In an embodiment, frame isolation within the payload sequence N is not necessary. CRC code B1_12 arrives at the receiver on cycle 15 and is compared to receiver CRC compressor 1412 B value B1_12x. The comparison of the B1_12x sent CRC is compared to the B1_12x derived CRC. In an embodiment the XOR (exclusive- or) of B1_12 and B1_12x is trapped as an isolation syndrome 1420 B1_12' on cycle 16, along with the type status 1422 of "frame". Likewise, C1_15 is sent on the bus driver 1408 on cycle 16, checked against C1_15x at the bus receiver 1410 on cycle 18, and trapped into the syndrome 1420 as C1_15' on cycle 19, along with type status of "lane".

In an embodiment, after payload sequences, N, O, and P are resent following a CRC recovery action, new payload sequence Q is sent. In an embodiment, after CRC compressors B and C send their CRC and reset, operations continue with CRC A as the default CRC. An embodiment includes changing the default CRC to one of the alternate CRCs following a recovery action, for example, from A to B.

Figure 15:
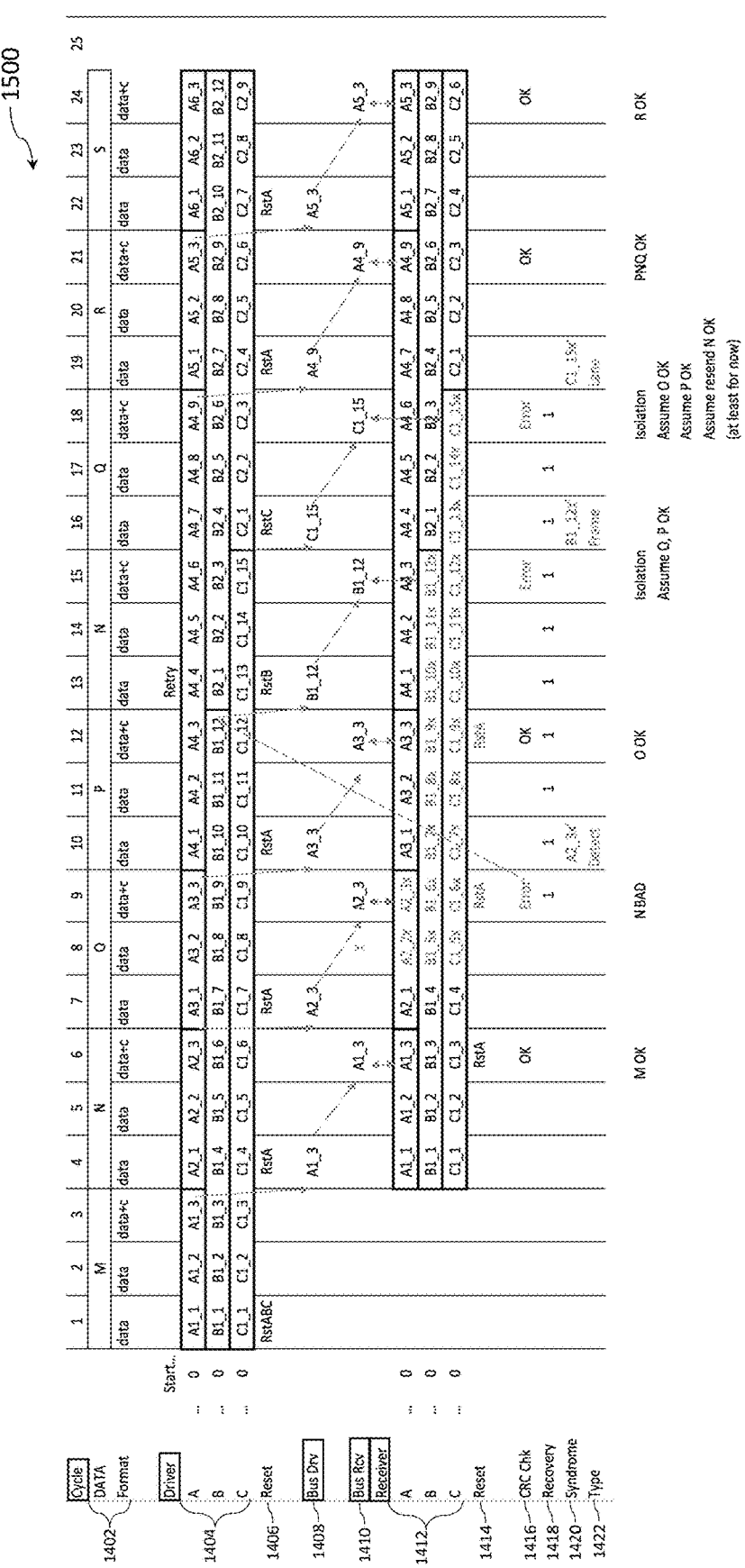
FIG. 15 depicts a timing diagram in a system that utilizes multiple CRCs for optimized fail isolation in accordance with one or more embodiments of the present invention.

Turning now to FIG. 15, a timing diagram 1500 of a system that utilizes multiple CRCs for optimized fail isolation is generally shown in accordance with one or more embodiments of the present invention. In an embodiment, if a payload sequence fails due to a CRC error, only the detected bad payload sequences need to be resent. Unlike the embodiment in FIG. 14, which shows that N, O, and P all have to be resent following the recovery sequence of N, this example shows an embodiment that only has to resend payload sequence N. Compared to FIG. 141, there are a few differences to note: CRC check 1416 on cycle 12 indicates that frame O is OK (rather than being ignored due to recovery, as shown in FIG. 14); following payload sequence N being prepared and sent in cycles 13-15, the next payload sequences are Q, R, and S (new payload sequences); CRC check for B on cycle 15, although not clean (B1_12 vs. B1_12x), assumes that payload sequences O and P are ok (for the time being) and will not be resent until they are checked later; CRC check for C on cycle 18, although not clean (C1_15 vs. C1_15x), assumes that payload sequences O, P, and the resending of N are ok (for the time being) and will not be resent until they are checked later; CRC check for A on cycle 21 (A4_9 vs. A4_9) is used to finally check the status of payload sequences P, and the resent N, and Q, if they are clean, no further recovery is needed, as shown.

In an example where either P, the resent N, or Q had errors, then A4_9 vs. A4_9x would start the recovery sequence again, starting with P, but would then require N and Q to be resent. In an embodiment, further use of frame isolation CRC (e.g., B) can be used to determine which of the payload sequences, P, the resent N, or Q, need to be resent. One or more embodiments of the present invention can be used to implement alternate CRC types, recovery rules and restrictions, orders, sequences, procedures, and timings not shown herein.

Which approach described herein to use, streaming compression or trace buffer, can be selected based on application requirements. For example, if it is important to get isolation at the payload level, and every payload with a problem needs to be identified, then a trace buffer implementation would be selected. This would provide a high performance coherent protocol where operations can be re-tried (or handled) at a more granular level. If the errors only occurred on frames associated with read operations they might be easily re-attempted whereas if the fails were associated with writes, an execution pipeline upstream may need to stall or check-point. For simpler applications where it's just sufficient to know the transmission failed, and to determine the type of fail (lane, beat, frame, etc.), then the streaming compression is relatively inexpensive to implement.

Another thing to consider when deciding between the two approaches has to do with the ration of CRC bits to payload bits. There is a finite delay associated with the transmission times that needs to be accounted for. It is likely that at least one set of multiple codes will need to be stored somewhere to account for the time lag from when the last C1 was sent until the driving side was made aware of the error and could then send the complete C1, C2, C3 set. During that turn-around time, the driving side will continue with sending frames and starting a new compression. Therefore, it will have to save the previous C1, C2, C3 set. If the ratio of payload to CRC is very large, then it will only need to save one set. Then once it has the good acknowledge returned, it knows it can safely overlay that stored set when the next C1 is sent. However, if the ratio is very small, such as one CRC frame for each payload frame, it may be necessary to store up to four sets because the system is re-compressing and sending new C1s faster than an acknowledge is received for the original C1. In this case, it may make sense to implement a full trace buffer.

In several of the examples described herein, three different types of CRCs are utilized. Embodiments of the invention are not limited to three types of CRCs as any number of CRCs greater than two can be implemented by exemplary embodiments of the present invention. The choice of CRC types and number of CRCs can vary and be determined based on implementation and/or application requirements.

Figure 16:
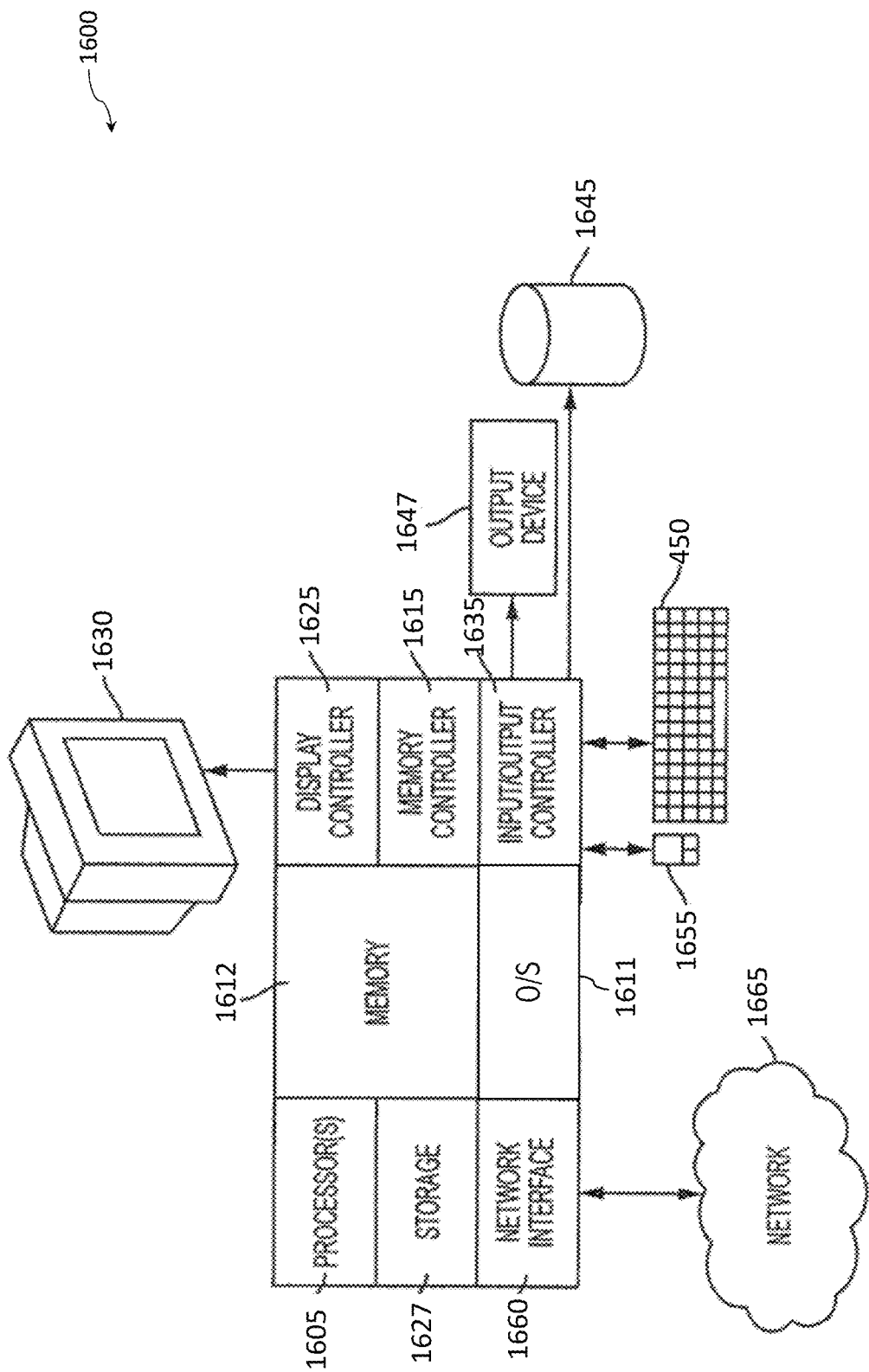
FIG. 16 is a block diagram of a computer system for implementing some or all aspects of utilizing multiple CRCs in accordance with one or more embodiments of the present invention.

Turning now to FIG. 16, a block diagram of a computer system for implementing some or all aspects of utilizing multiple CRCs is generally shown in accordance with one or more embodiments of the present invention. The processing described herein may be implemented in hardware, software (e.g., firmware), or a combination thereof. In an exemplary embodiment, the methods described may be implemented, at least in part, in hardware and may be part of the microprocessor of a special or general-purpose computer system 1600, such as a mobile device, personal computer, workstation, minicomputer, or mainframe computer.

In an exemplary embodiment, as shown in FIG. 16, the computer system 1600 includes a processor 1605, memory 1612 coupled to a memory controller 1615, and one or more input devices 1645 and/or output devices 1647, such as peripherals, that are communicatively coupled via a local I/O controller 1635. These devices 1647 and 1645 may include, for example, a printer, a scanner, a microphone, and the like. A conventional keyboard 1650 and mouse 1655 may be coupled to the I/O controller 1635. The I/O controller 1635 may be, for example, one or more buses or other wired or wireless connections, as are known in the art. The I/O controller 1635 may have additional elements, which are omitted for simplicity, such as controllers, buffers (caches), drivers, repeaters, and receivers, to enable communications.

The I/O devices 1647, 1645 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 1605 is a hardware device for executing hardware instructions or software, particularly those stored in memory 1612. The processor 1605 may be a custom made or commercially available processor, a central processing unit (CPU), an auxiliary processor among several processors associated with the computer system 1600, a semiconductor based microprocessor (in the form of a microchip or chip set), a microprocessor, or other device for executing instructions. The processor 1605 can include a cache such as, but not limited to, an instruction cache to speed up executable instruction fetch, a data cache to speed up data fetch and store, and a translation look-aside buffer (TLB) used to speed up virtual-to-physical address translation for both executable instructions and data. The cache may be organized as a hierarchy of more cache levels (L1, L2, etc.).

The memory 1612 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1612 may incorporate electronic, magnetic, optical, or other types of storage media. Note that the memory 1612 may have a distributed architecture, where various components are situated remote from one another but may be accessed by the processor 1605.

The instructions in memory 1612 may include one or more separate programs, each of which comprises an ordered listing of executable instructions for implementing logical functions. In the example of FIG. 16, the instructions in the memory 1612 include a suitable operating system (OS) 1612. The operating system 1612 essentially may control the execution of other computer programs and provides scheduling, input-output control, file and data management, memory management, and communication control and related services.

Additional data, including, for example, instructions for the processor 1605 or other retrievable information, may be stored in storage 1627, which may be a storage device such as a hard disk drive or solid state drive. The stored instructions in memory 1612 or in storage 1627 may include those enabling the processor to execute one or more aspects of the dispatch systems and methods of this disclosure.

The computer system 1600 may further include a display controller 1625 coupled to a display 1630. In an exemplary embodiment, the computer system 1600 may further include a network interface 1660 for coupling to a network 1665. The network 1665 may be an IP-based network for communication between the computer system 1600 and an external server, client and the like via a broadband connection. The network 1665 transmits and receives data between the computer system 1600 and external systems. In an exemplary embodiment, the network 1665 may be a managed IP network administered by a service provider. The network 1665 may be implemented in a wireless fashion, e.g., using wireless protocols and technologies, such as WiFi, WiMax, etc. The network 1665 may also be a packet-switched network such as a local area network, wide area network, metropolitan area network, the Internet, or other similar type of network environment. The network 1665 may be a fixed wireless network, a wireless local area network (LAN), a wireless wide area network (WAN) a personal area network (PAN), a virtual private network (VPN), intranet or other suitable network system and may include equipment for receiving and transmitting signals.

Systems and methods for providing multiple CRCs for optimized fail isolation as described herein can be embodied, in whole or in part, in computer program products or in computer systems 1600, such as that illustrated in FIG. 16.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
    calculating, by a transmitter, source cyclic redundancy code (CRC) bits for payload bits in one or more frames of bits, the source CRC bits comprising source CRC bits for a first type of CRC check and source CRC bits for a second type of CRC check, the source CRC bits for the second type of CRC check distinct from the source CRC bits for the first type of CRC check, the transmitter coupled to a receiver via a communication channel;
    storing the source CRC bits at the transmitter;
    transmitting, via the communication channel, the payload bits and the source CRC bits for the first type of CRC check to the receiver, wherein the receiver calculates and stores calculated CRC bits for the first type of CRC check and the second type of CRC check, and performs the first type of CRC check based at least in part on the calculated CRC bits for the first type of CRC check and the source CRC bits for the first type of CRC check;
    receiving, at the transmitter, a status of the first type of CRC check from the receiver; and
    based on the status of the first type of CRC check indicating an error, initiating a comparison of the source CRC bits for the second type of CRC check and the calculated CRC bits for the second type of CRC check.

2. The computer-implemented method of claim 1, wherein the comparison is performed by the transmitter, and the calculated CRC bits for the second type of CRC check are transmitted, via the communication channel, from the receiver to the transmitter.

3. The computer-implemented method of claim 1, wherein the comparison is performed by the receiver, and the source CRC bits for the second type of CRC check are transmitted, via the communication channel, from the transmitter to the receiver.

4. The computer-implemented method of claim 1, wherein the source CRC bits for the first type of CRC check and the source CRC bits for the second type of CRC check are calculated simultaneously.

5. The computer-implemented method of claim 1, wherein the source CRC bits are stored in a buffer at the transmitter and the calculated source CRC bits for the first and second type of CRC check are stored in a buffer at the receiver.

6. The computer-implemented method of claim 5, wherein a depth of the buffer is based at least in part on a latency of transmitting and the receiving a status.

7. The computer-implemented method of claim 1, wherein the first type of CRC check is optimized for detecting errors and the second type of CRC check is optimized for isolating errors.

8. The computer-implemented method of claim 1, wherein based on the status of the first CRC check indicating an error, initiating an increase in the CRC rate, the increase synchronized between the transmitter and the receiver.

9. The computer-implemented method of claim 1, wherein based on the status of the first CRC check indicating an error, initiating transmitting the source CRC bits for the second type of CRC check to the receiver in place of the source CRC bits for the first type of CRC check, wherein the change is synchronized between the transmitter and the receiver.

10. The computer-implemented method of claim 1, wherein the receiver is a distributed memory buffer, the transmitter is a host computer, and the communication channel comprises a plurality of memory channels.

11. The computer-implemented method of claim 1, wherein the receiver is a unified memory buffer, the transmitter is a host computer, and the communication channel is a memory channel.

12. A system comprising:
    a memory having computer readable instructions; and
    one or more processors for executing the computer readable instructions, the computer readable instructions controlling the one or more processors to perform operations comprising:
    calculating, by a transmitter, source cyclic redundancy code (CRC) bits for payload bits in one or more frames of bits, the source CRC bits comprising source CRC bits for a first type of CRC check and source CRC bits for a second type of CRC check, the source CRC bits for the second type of CRC check distinct from the source CRC bits for the first type of CRC check, the transmitter coupled to a receiver via a communication channel;
    storing the source CRC bits at the transmitter;
    transmitting, via the communication channel, the payload bits and the source CRC bits for the first type of CRC check to the receiver, wherein the receiver calculates and stores calculated CRC bits for the first type of CRC check and the second type of CRC check, and performs the first type of CRC check based at least in part on the calculated CRC bits for the first type of CRC check and the source CRC bits for the first type of CRC check;
    receiving, at the transmitter, a status of the first type of CRC check from the receiver; and
    based on the status of the first type of CRC check indicating an error, initiating a comparison of the source CRC bits for the second type of CRC check and the calculated CRC bits for the second type of CRC check.

13. The system of claim 12, wherein the comparison is performed by the transmitter, and the calculated CRC bits for the second type of CRC check are transmitted, via the communication channel, from the receiver to the transmitter.

14. The system of claim 12, wherein the comparison is performed by the receiver, and the source CRC bits for the second type of CRC check are transmitted, via the communication channel, from the transmitter to the receiver.

15. The system of claim 12, wherein the receiver is a distributed memory buffer, the transmitter is a host computer, and the communication channel comprises a plurality of memory channels.

16. The system of claim 12, wherein the receiver is a unified memory buffer, the transmitter is a host computer, and the communication channel is a memory channel.

17. A computer program product comprising a computer readable storage medium having program instructions embodied therewith, the program instructions executable by a processor to cause the processor to perform operations comprising:

calculating, by a transmitter, source cyclic redundancy code (CRC) bits for payload bits in one or more frames of bits, the source CRC bits comprising source CRC bits for a first type of CRC check and source CRC bits for a second type of CRC check, the source CRC bits for the second type of CRC check distinct from the source CRC bits for the first type of CRC check, the transmitter coupled to a receiver via a communication channel;

storing the source CRC bits at the transmitter;

transmitting, via the communication channel, the payload bits and the source CRC bits for the first type of CRC check to the receiver, wherein the receiver calculates and stores calculated CRC bits for the first type of CRC check and the second type of CRC check, and performs the first type of CRC check based at least in part on the calculated CRC bits for the first type of CRC check and the source CRC bits for the first type of CRC check;

receiving, at the transmitter, a status of the first type of CRC check from the receiver; and based on the status of the first type of CRC check indicating an error, initiating a comparison of the source CRC bits for the second type of CRC check and the calculated CRC bits for the second type of CRC check.

18. The computer program product of claim 17, wherein the receiver is a distributed memory buffer, the transmitter is a host computer, and the communication channel comprises a plurality of memory channels.

19. The computer program product of claim 17, wherein the receiver is a unified memory buffer, the transmitter is a host computer, and the communication channel is a memory channel.

* * * * *